(12) United States Patent
Masuduzzaman et al.

(10) Patent No.: US 9,779,832 B1
(45) Date of Patent: Oct. 3, 2017

(54) PULSED CONTROL LINE BIASING IN MEMORY

(71) Applicant: SanDisk Technologies LLC, Plano, TX (US)

(72) Inventors: Muhammad Masuduzzaman, Milpitas, CA (US); Deepanshu Dutta, Fremont, CA (US); Jong Yuh, Pleasanton, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/371,462

(22) Filed: Dec. 7, 2016

(51) Int. Cl.
| G11C 7/10 | (2006.01) |
| G11C 16/34 | (2006.01) |
| G11C 16/04 | (2006.01) |
| G11C 16/10 | (2006.01) |
| G11C 16/26 | (2006.01) |
| G11C 16/16 | (2006.01) |
| G11C 16/08 | (2006.01) |
| G11C 7/22 | (2006.01) |

(52) U.S. Cl.
CPC ...... *G11C 16/3459* (2013.01); *G11C 16/0483* (2013.01); *G11C 16/08* (2013.01); *G11C 16/10* (2013.01); *G11C 16/16* (2013.01); *G11C 16/26* (2013.01); *G11C 16/3495* (2013.01); *G11C 7/1051* (2013.01); *G11C 7/1078* (2013.01); *G11C 7/22* (2013.01)

(58) Field of Classification Search
CPC ........ G11C 7/1051; G11C 7/1078; G11C 7/22
USPC .................................................. 365/189.05
See application file for complete search history.

(56) References Cited

U.S. PATENT DOCUMENTS

| 3,691,404 | A | 9/1972 | Swygert, Jr. |
| 4,170,747 | A | 10/1979 | Holmes |
| 5,623,444 | A | 4/1997 | Gotou et al. |
| 5,812,458 | A | 9/1998 | Gotou |
| 5,956,272 | A | 9/1999 | Roohparvar |
| 7,173,867 | B2 * | 2/2007 | Terzioglu ............. G11C 29/848 365/189.05 |
| 7,403,421 | B2 | 7/2008 | Mokhlesi et al. |
| 7,821,315 | B2 | 10/2010 | Bossu et al. |
| 8,116,140 | B2 | 2/2012 | Dong et al. |
| 8,279,686 | B2 | 10/2012 | Hsu et al. |
| 8,385,132 | B2 | 2/2013 | Dutta et al. |
| 8,804,434 | B2 | 8/2014 | Benten |
| 2014/0021931 | A1 | 1/2014 | Pancholi et al. |
| 2014/0269009 | A1 | 9/2014 | Ghosh et al. |

(Continued)

*Primary Examiner* — Jason Lappas
(74) *Attorney, Agent, or Firm* — Vierra Magen Marcus LLP

(57) ABSTRACT

In one aspect, a voltage is provided as a rectangular waveform in which the duty cycle is varied to provide different effective voltages. These voltages may be applied to various control lines in a memory device such as a word line, bit line and/or source line, in a program, verify, read or erase operation. In some cases, the duty cycle is a function of programming data of a memory cell such as an assigned data state or a programming speed category. The duty cycle could also be a function of a programming phase or other criterion. The duty cycle can be varied by modifying the duration and separation of the pulses of the waveform or by pulse counting, in which a specified number of pulses are passed in a time period.

17 Claims, 29 Drawing Sheets

(56) References Cited

U.S. PATENT DOCUMENTS

2016/0027515 A1   1/2016   Kellam et al.
2016/0141301 A1   5/2016   Mokhlesi et al.

* cited by examiner

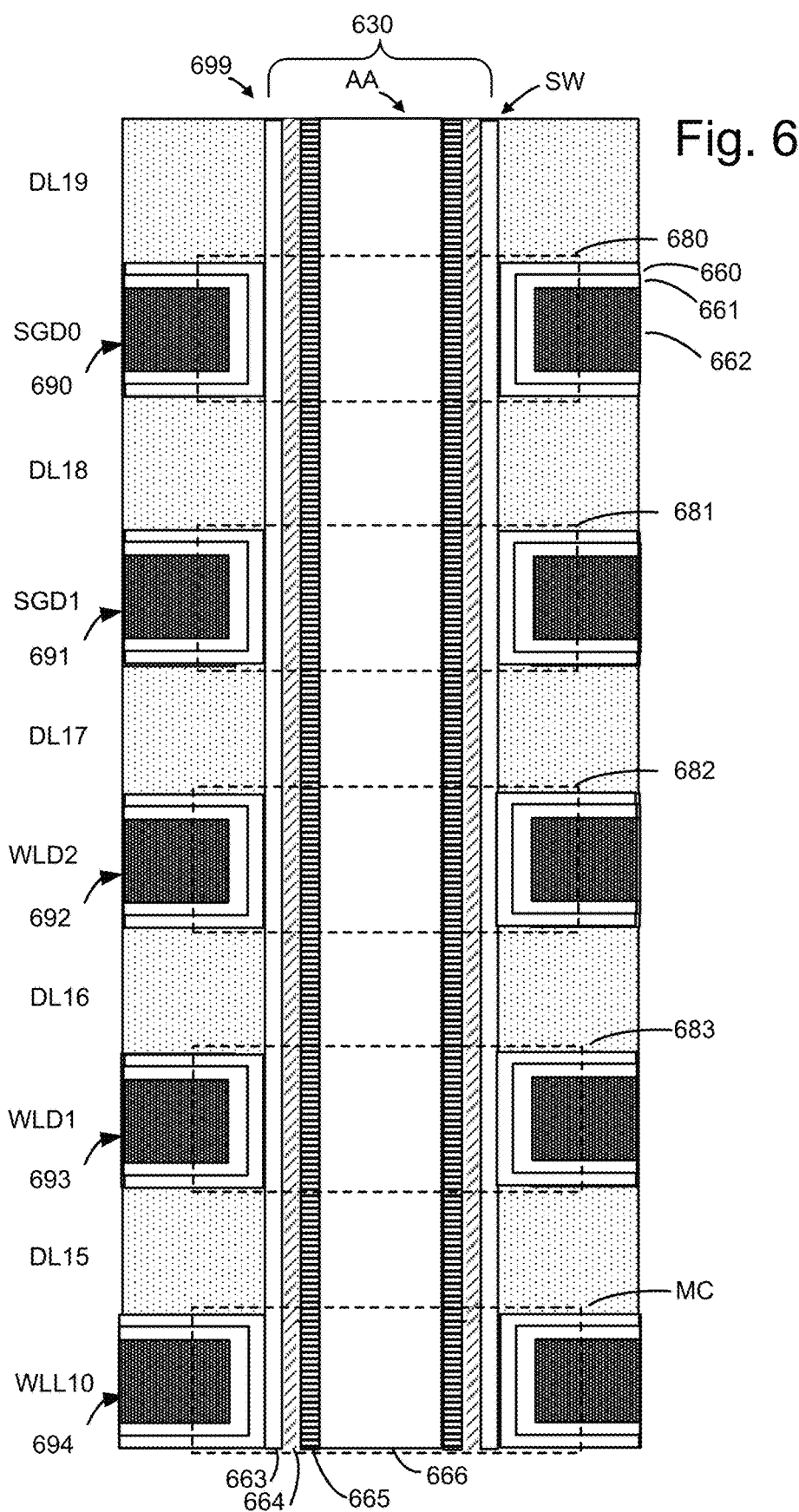

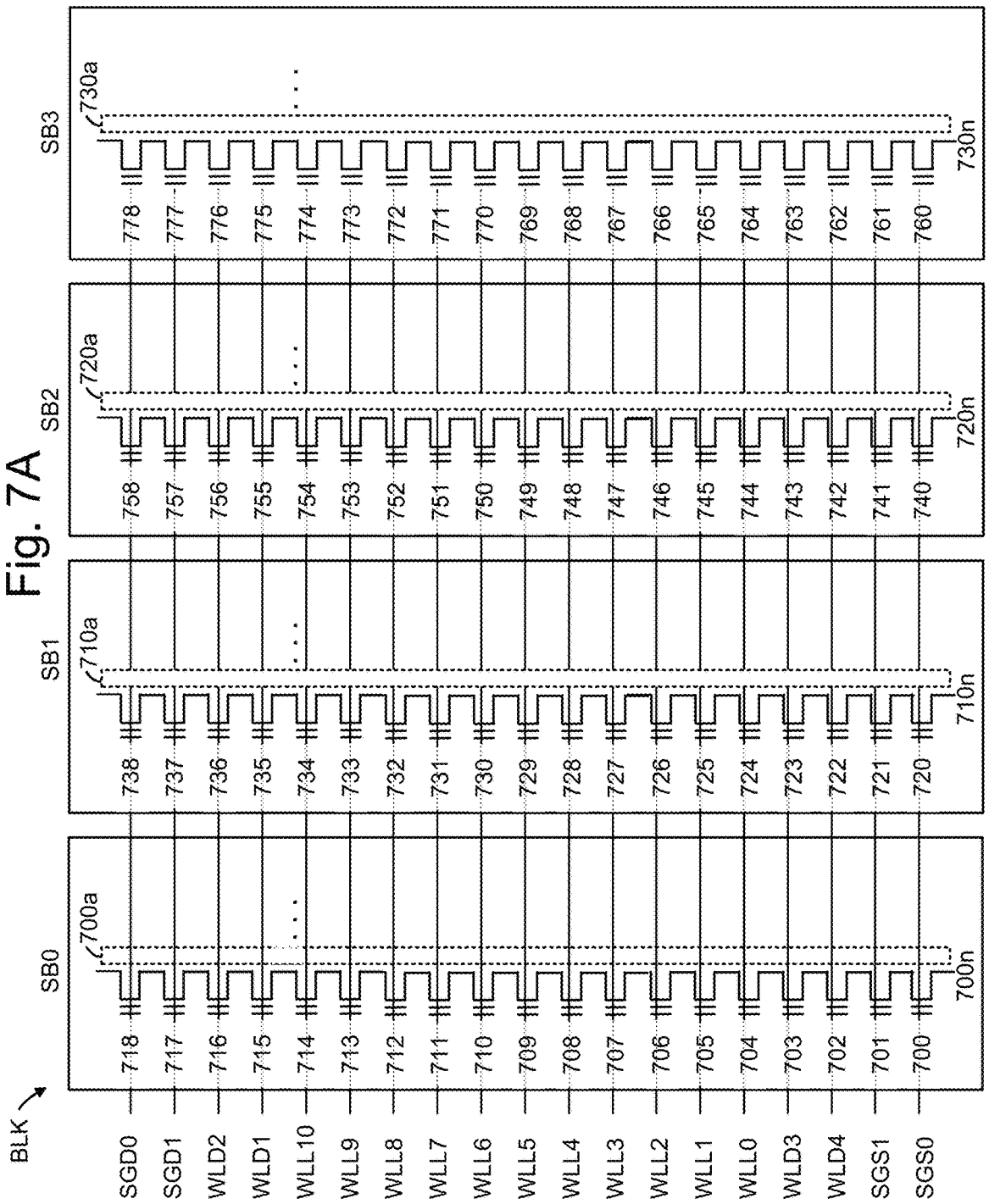

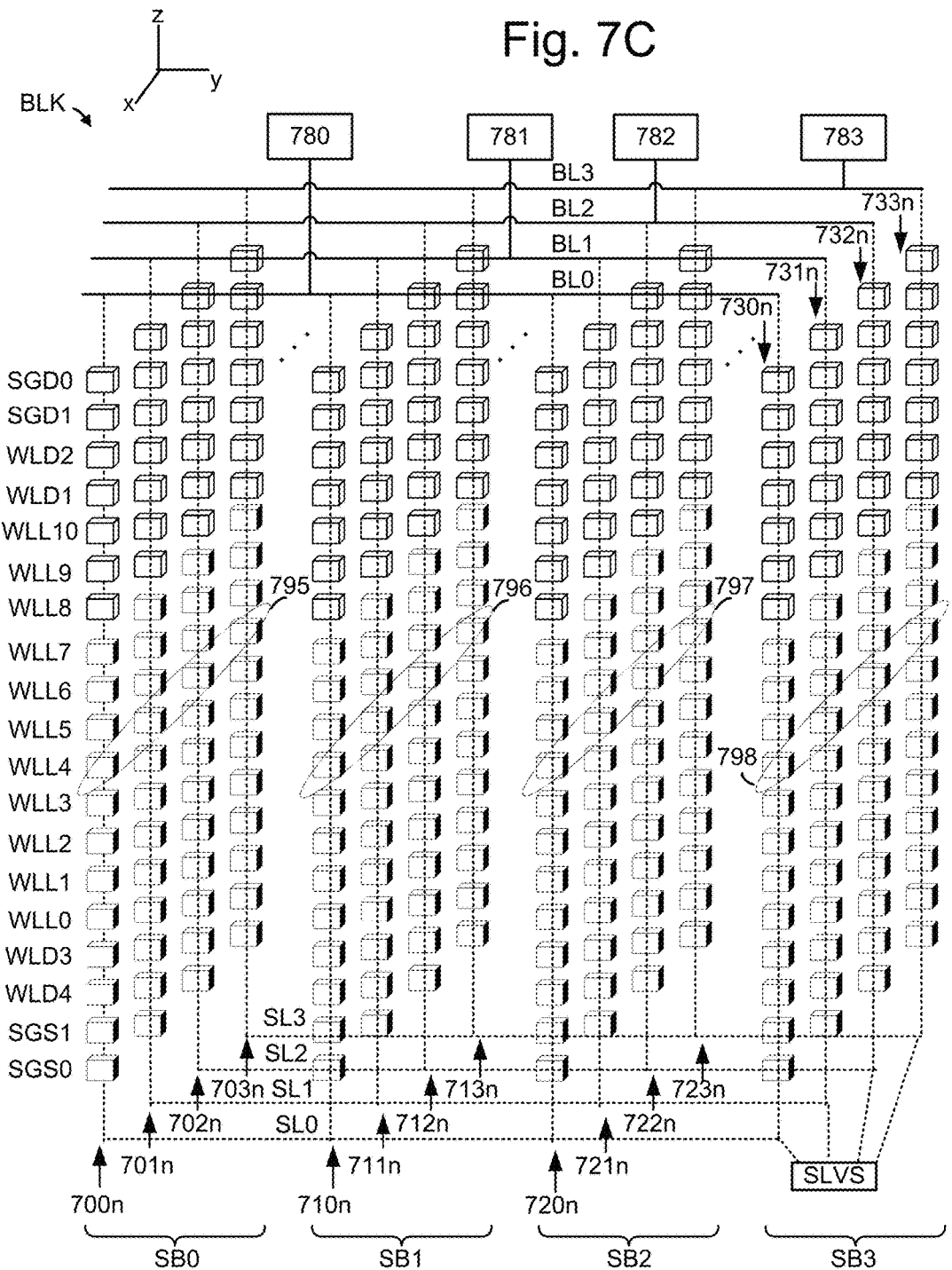

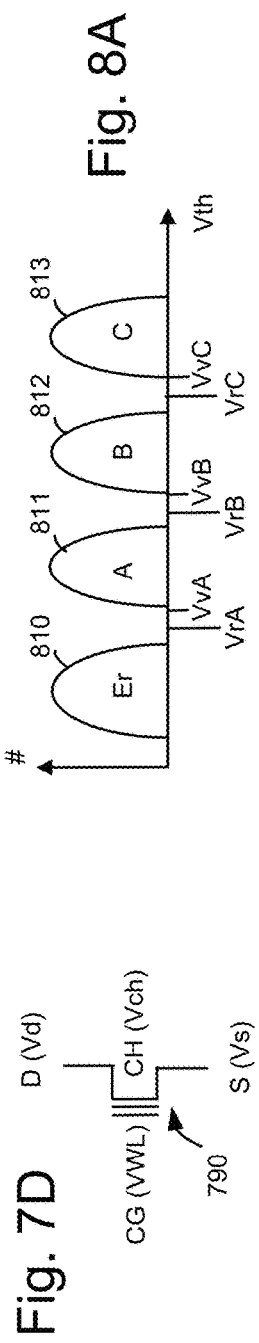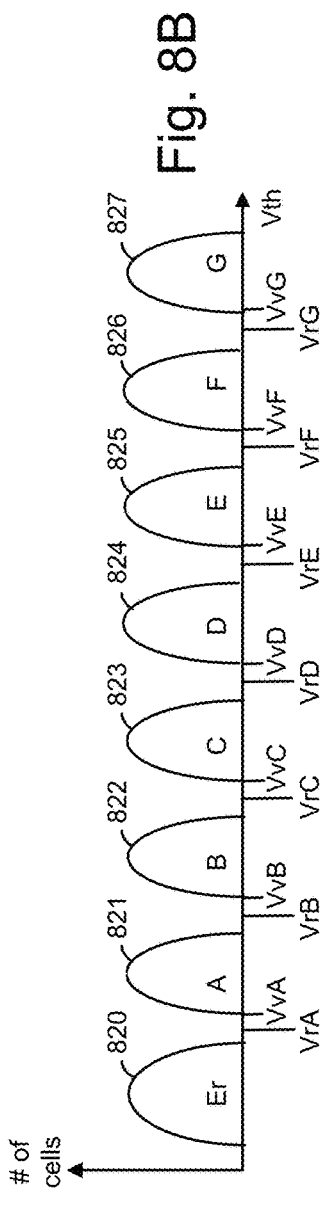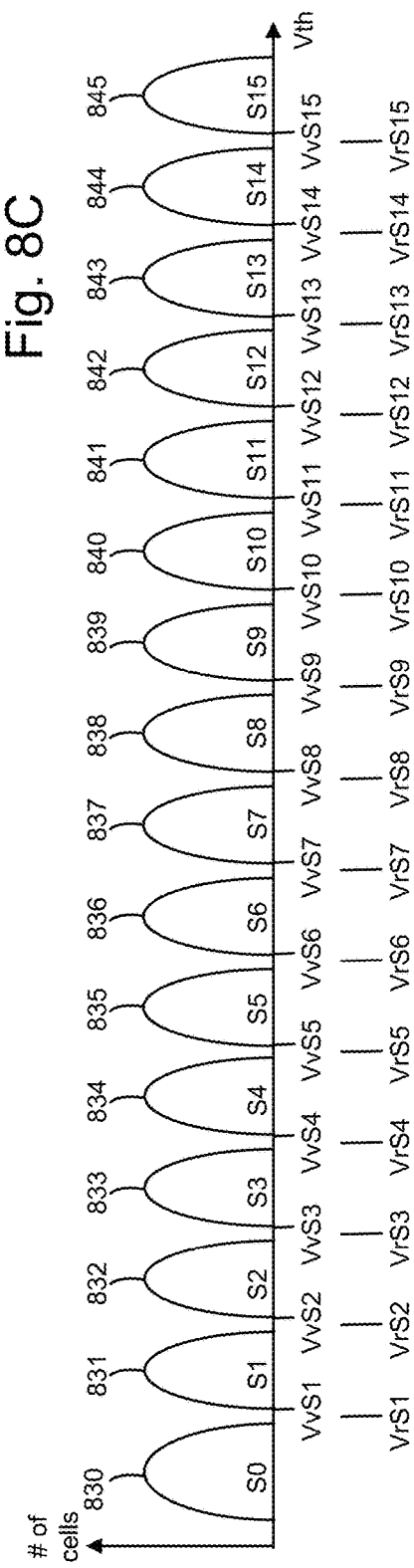

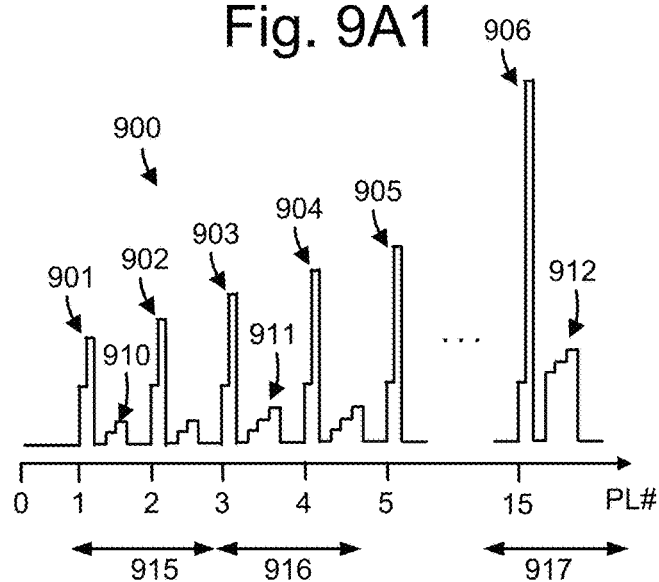
Fig. 9A1
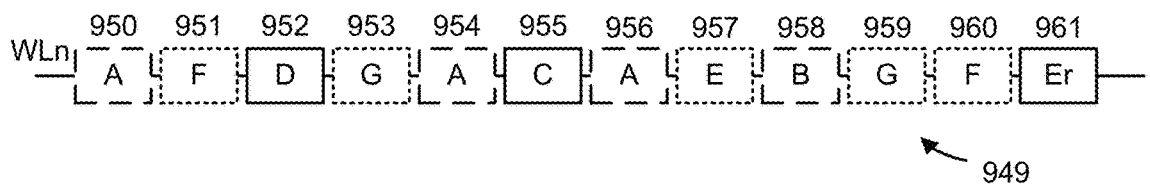
Fig. 9A2
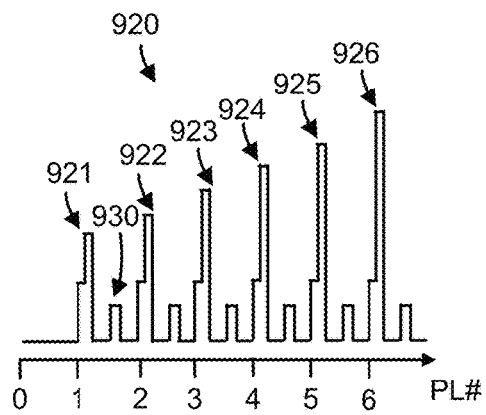
Fig. 9B

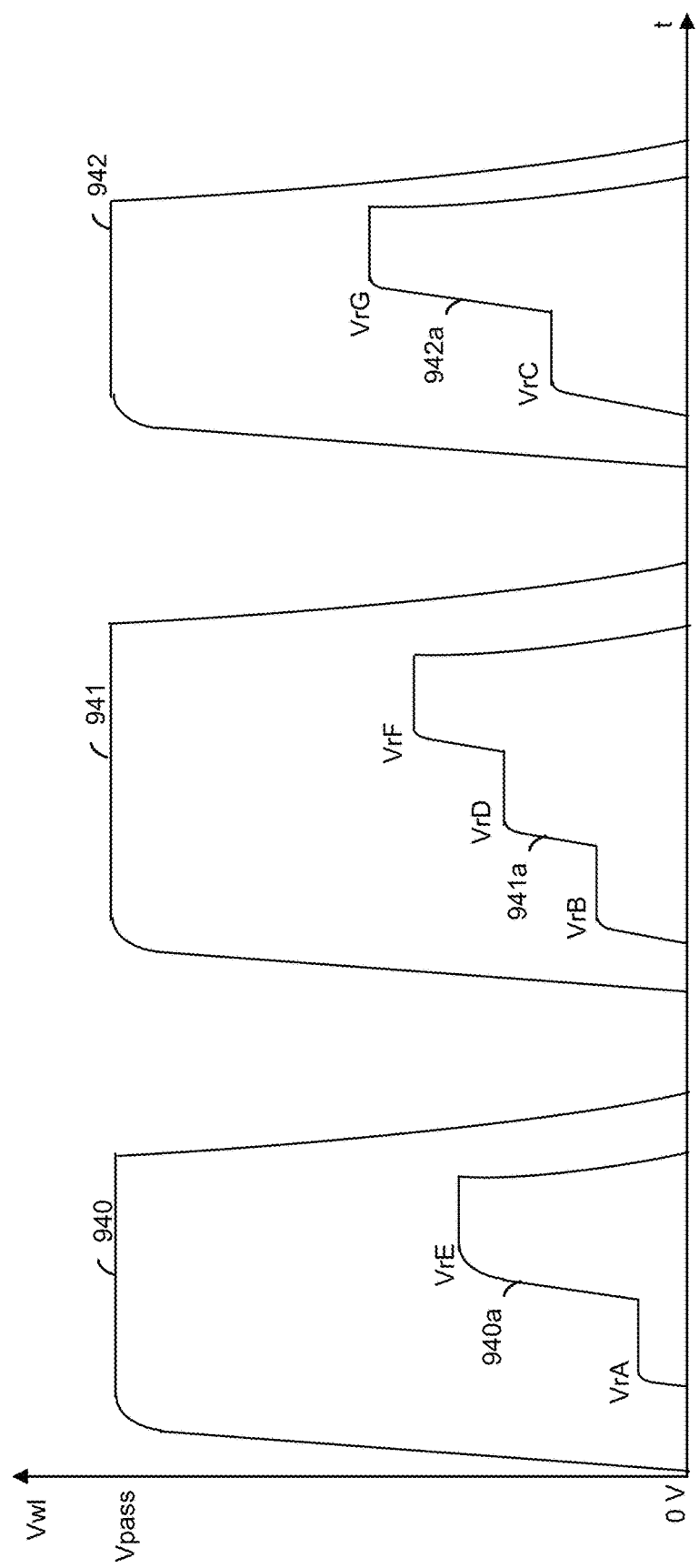

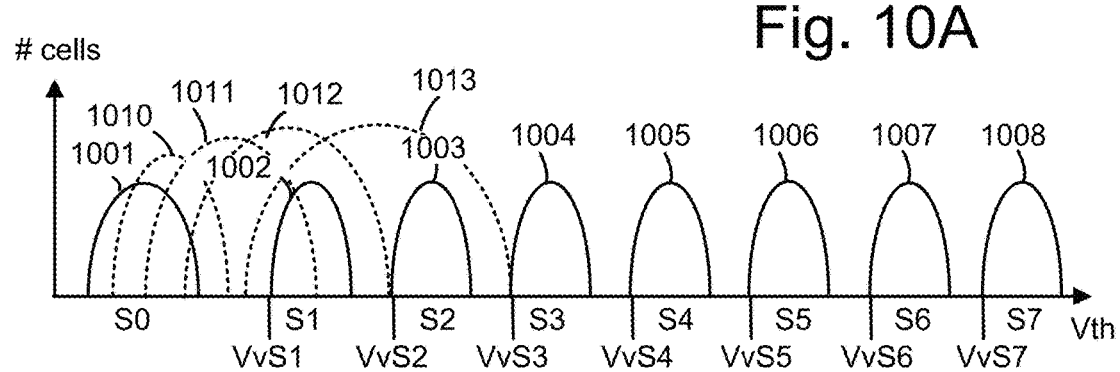
Fig. 10A
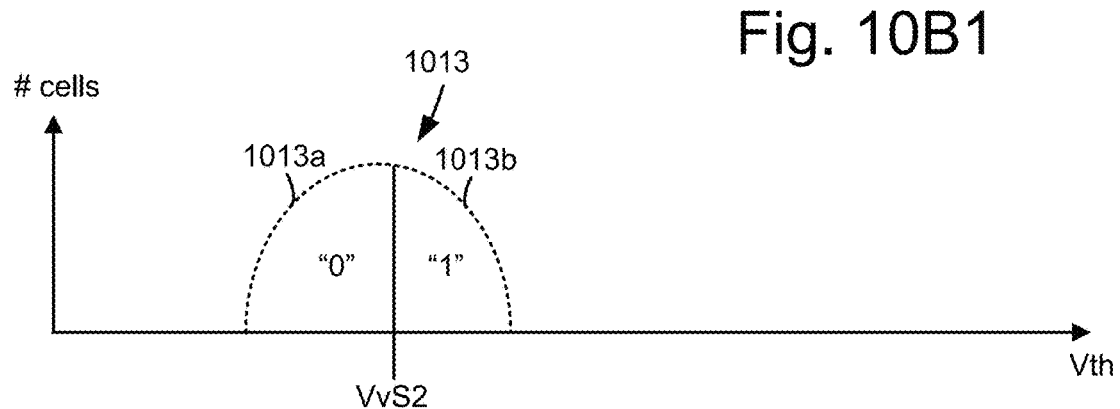
Fig. 10B1
Fig. 10B2
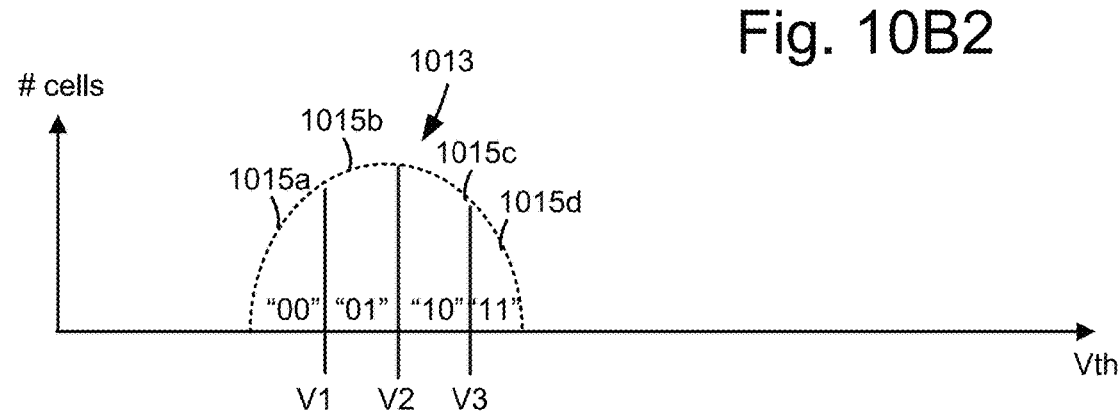
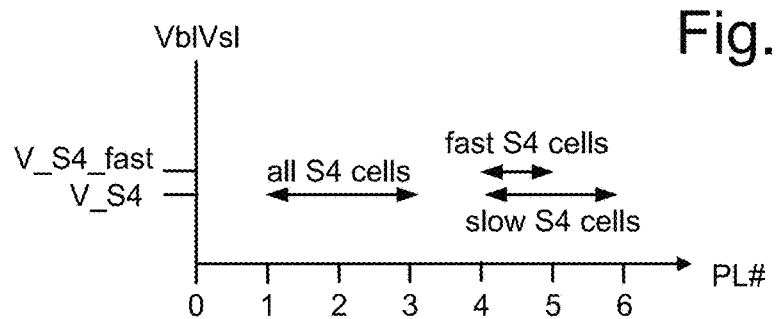
Fig. 10C

Fig. 12A

|       | Bit line voltage: BL (V) | | | | Source line voltage: SL (V) | | | |
|-------|---------|---------|--------|------|---------|---------|--------|------|
| State | Program | Inhibit | Verify | Read | Program | Inhibit | Verify | Read |
| S0 | 6.0 | 6.0 | 6.0 | 0.0 | 6.0 | 6.0 | 6.0 | 0.5 |
| S1 | 4.8 | 6.0 | 4.8 | 0.0 | 4.8 | 6.0 | 5.3 | 0.5 |
| S2 | 4.0 | 6.0 | 4.0 | 0.0 | 4.0 | 6.0 | 4.5 | 0.5 |
| S3 | 3.2 | 6.0 | 3.2 | 0.0 | 3.2 | 6.0 | 3.7 | 0.5 |
| S4 | 2.4 | 6.0 | 2.4 | 0.0 | 2.4 | 6.0 | 2.9 | 0.5 |
| S5 | 1.6 | 6.0 | 1.6 | 0.0 | 1.6 | 6.0 | 2.1 | 0.5 |
| S6 | 0.8 | 6.0 | 0.8 | 0.0 | 0.8 | 6.0 | 1.3 | 0.5 |
| S7 | 0.0 | 6.0 | 0.0 | 0.0 | 0.0 | 6.0 | 0.5 | 0.5 |

Fig. 12B

| Line name | Prog/Inhibit | Verify | Read |
|-----------|--------------|--------|------|
| VSGD | 6V | 8V | 4V |
| WL # ≥ N+1 | 9V | 6V | 7V |
| WL N | VPGM | 5.2V | VCGR |
| WL # ≤ N−1 | 9V | 12V | 7V |
| VSGS | 6V | 8V | 4V |

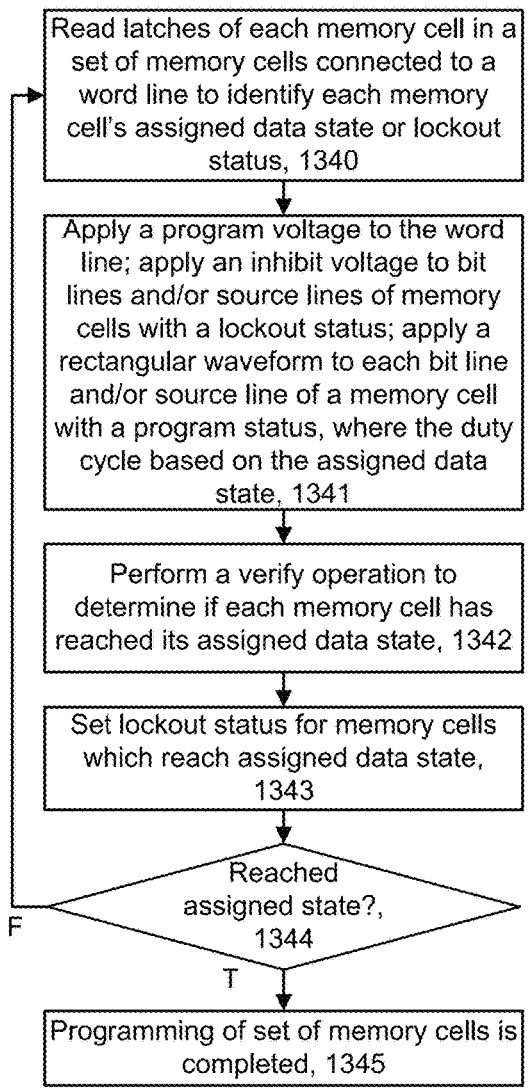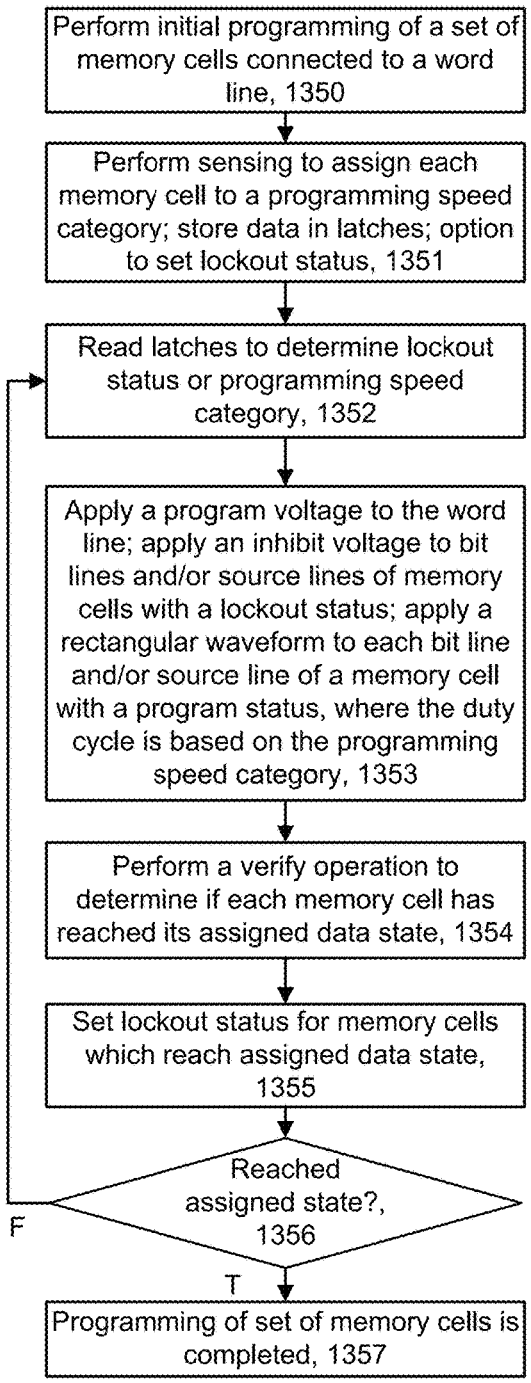
Fig. 13E
Fig. 13F

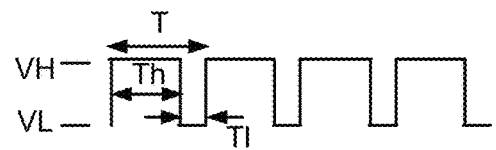
Fig. 14A
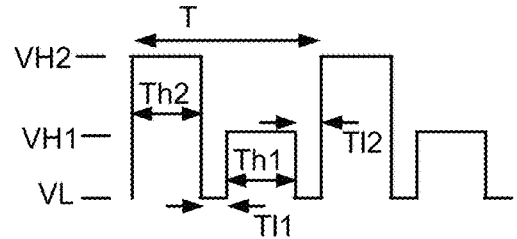
Fig. 14B
Fig. 14C
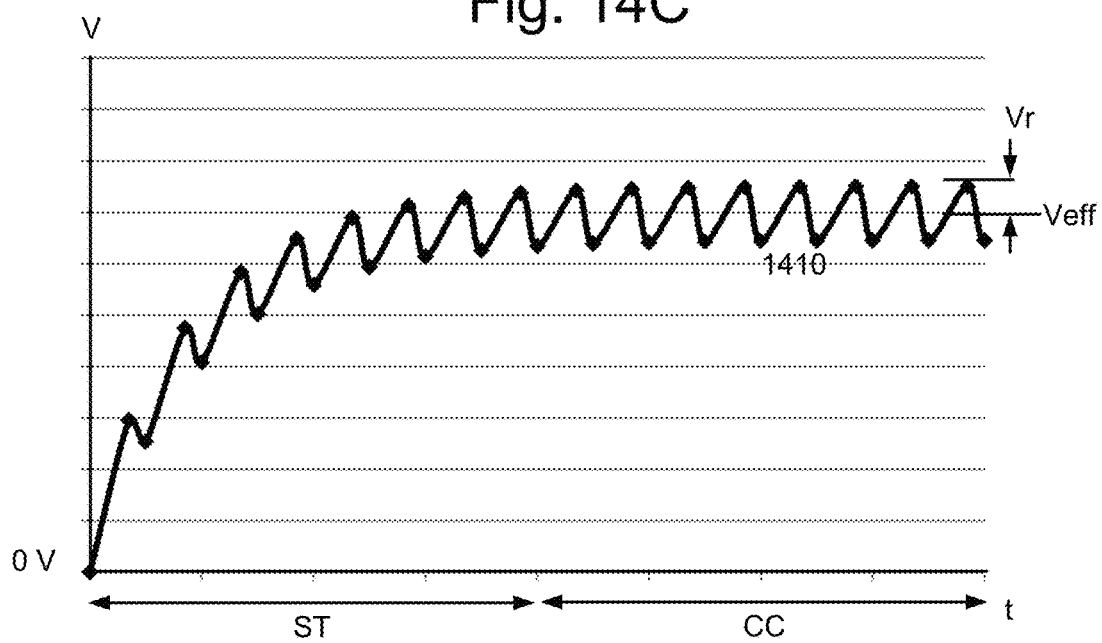
Fig. 14D
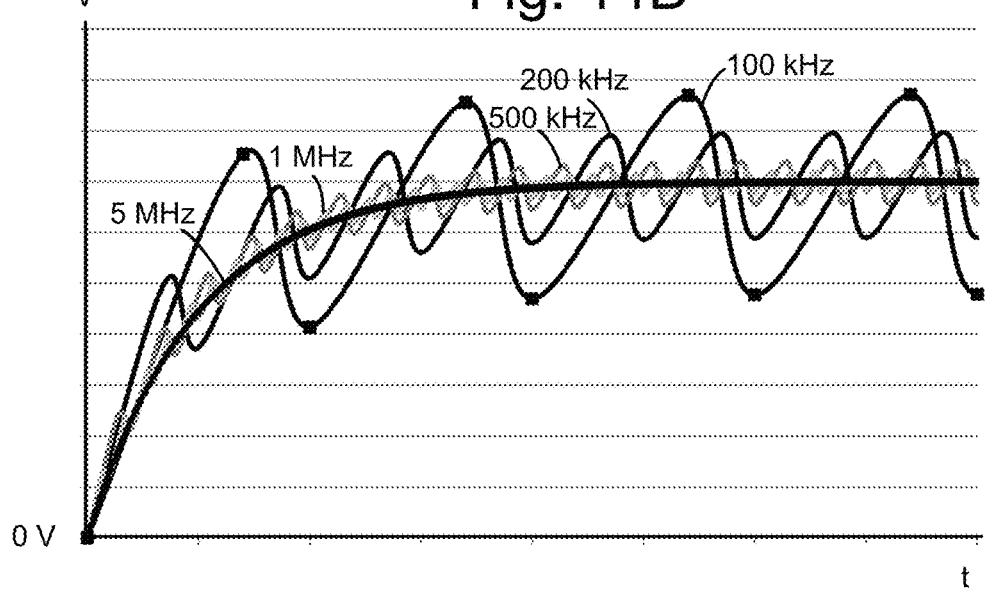

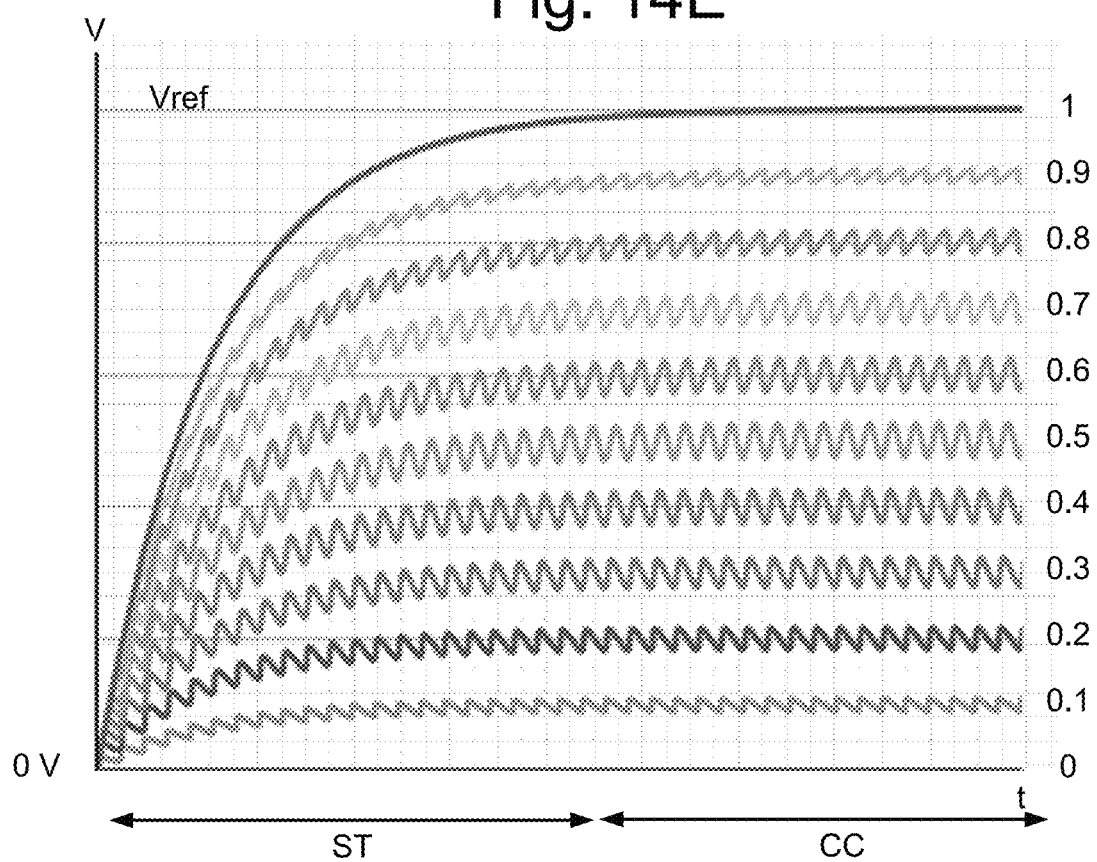

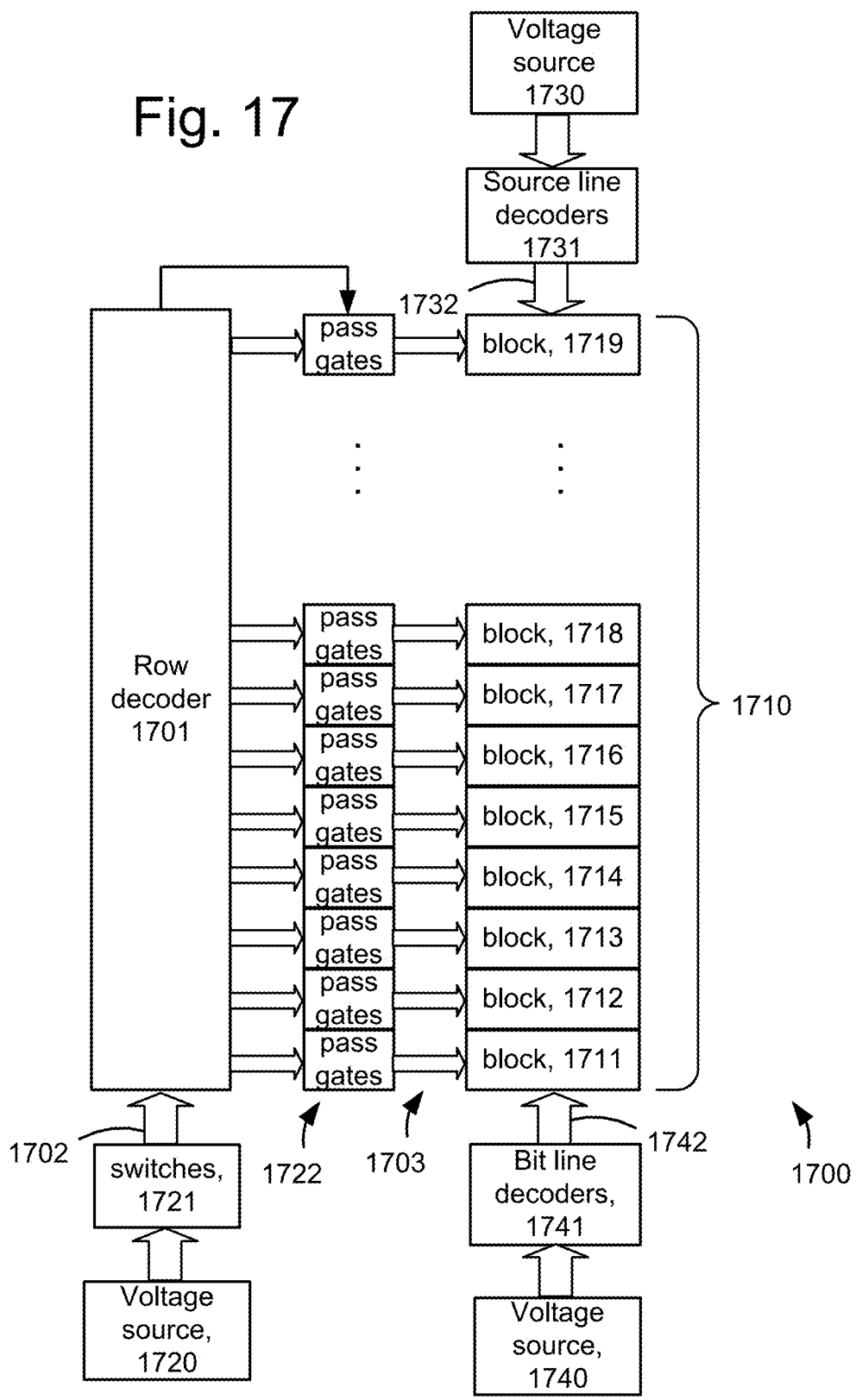

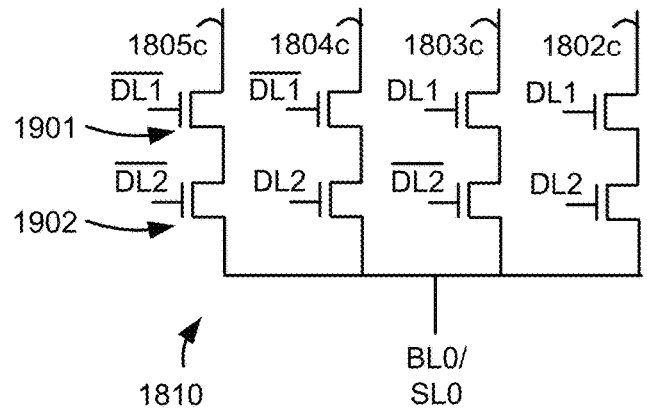
Fig. 19A
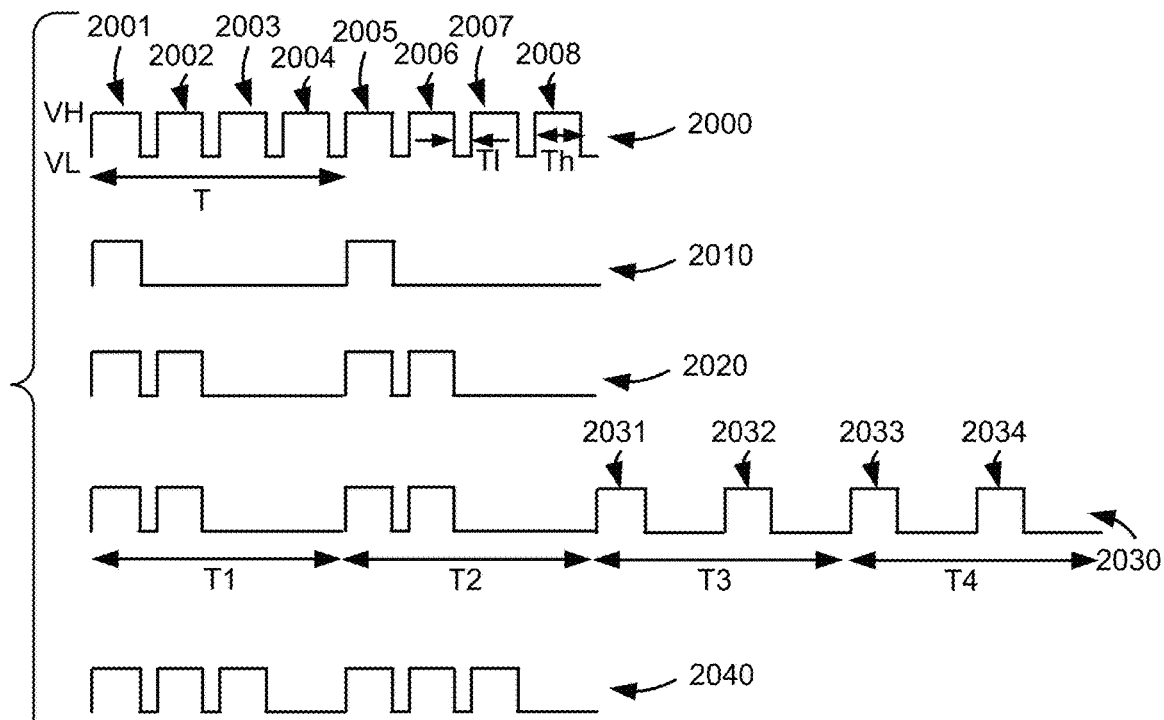
Fig. 19B
Fig. 20

PULSED CONTROL LINE BIASING IN MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 6 depicts a close-up view of the region 622 of the stack of FIG. 4.

FIG. 7A depicts an example view of NAND strings in sub-blocks in a 3D configuration which is consistent with FIG. 4.

FIG. 7C depicts additional detail of the sub-blocks SB0-SB3 of FIG. 7A, in a configuration where source lines are separate.

FIG. 7D depicts an example memory cell 790.

FIG. 8A depicts an example threshold voltage (Vth) distribution of memory cells, where four data states are used.

FIG. 8B depicts an example Vth distribution of memory cells, where eight data states are used.

FIG. 8C depicts an example Vth distribution of memory cells, where sixteen data states are used.

FIG. 9A1 depicts a waveform of an example programming operation, where different verify voltages are applied for verifying different data states.

FIG. 9A2 depicts example subsets of cells consistent with the programming phases of FIG. 9A1.

FIG. 9B depicts a waveform of an example programming operation, where one verify voltage is applied for verifying different data states.

FIG. 9C depicts a plot of example waveforms in a read operation, where a rectangular waveform is used to provide read voltages on a control line.

FIG. 10A depicts threshold voltages distributions during an example programming operation consistent with the waveform of FIG. 9A1.

FIG. 10B1 depicts the Vth distribution 1013 of FIG. 10A showing how memory cells can be assigned to one of two program speed categories.

FIG. 10B2 depicts the Vth distribution 1013 of FIG. 10A showing how memory cells can be assigned to one of four program speed categories.

FIG. 10C depicts a plot of bit line voltage (Vbl) and/or source line voltage (Vsl) versus program loop number, showing different voltages based on programming speed category, consistent with the Vth distribution of FIG. 10B1 and the programming waveform of FIG. 9B.

FIG. 11A depicts the results of applying the first program voltage in FIG. 9B.

FIG. 11B depicts the results of applying the second program voltage in FIG. 9B.

FIG. 11C depicts the results of applying the third program voltage in FIG. 9B.

FIG. 11D depicts the results of applying the fourth program voltage in FIG. 9B.

FIG. 11E depicts the results of applying the fifth program voltage in FIG. 9B.

FIG. 12A is a table that identifies one embodiment of data dependent source line voltages and bit line voltages for programming, verifying and reading, consistent with FIGS. 9B and 11A to 11E.

FIG. 12B is a table that provides example voltages for the drain side select signal (VSGD), source side select signal (VSGS), selected word line (WL N), unselected word lines on the source side of the selected word line (WL#≤N−1), and unselected word lines on the drain side of the selected word line (WL#≥N+1), consistent with FIGS. 11A to 11E and FIG. 12.

FIG. 13E depicts an example programming operation similar to FIG. 13D but for a set of memory cells.

FIG. 13F depicts an example programming operation for a set of memory cells consistent with FIG. 13A in which a rectangular waveform is applied to bit lines and/or source lines based on a programming while a program voltage is applied to a control gate of the memory cells.

FIG. 14A depicts an example rectangular waveform which alternates between a lower voltage VL and a higher voltage VH.

FIG. 14B depicts an example rectangular waveform which varies between a lower voltage VL and two higher voltages VH1 and VH2.

FIG. 14C depicts a voltage on a control line which receives the rectangular waveform of FIG. 14A, showing a settling time (ST) and a cyclostationary condition (CC).

FIG. 14D depicts a voltage on a control line which receives the rectangular waveform of FIG. 14A, where the rectangular waveform is provided at different frequencies.

FIG. 14E depicts a voltage on a control line which receives the rectangular waveform of FIG. 14A, where the rectangular waveform is provided at different duty cycles.

FIG. 17 depicts an example circuit for providing voltages to blocks of memory cells.

FIG. 19A depicts an example decoder consistent with FIGS. 18A and 18B.

FIG. 19B depicts an example table showing data values for the transistors in the decoder of FIG. 19A.

FIG. 20 depicts examples of rectangular waveforms with different duty cycles using pulse counting, consistent with FIG. 18B.

DETAILED DESCRIPTION

Apparatuses and techniques are described which efficiently provide different voltages for use by a memory or other semiconductor device.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

Figure 1:
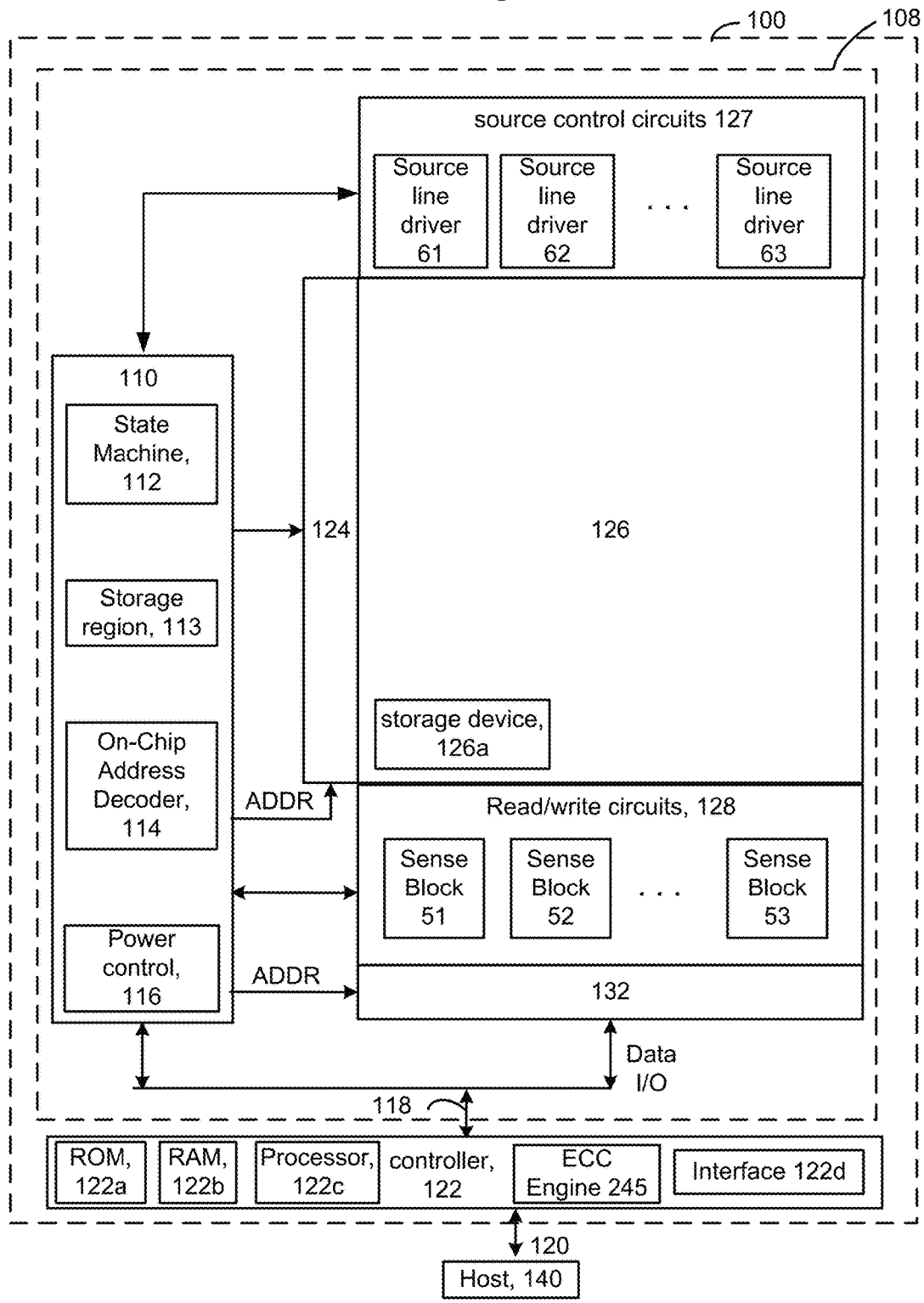
FIG. 1 is a block diagram of an example memory device.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIGS. 9A1 and 9B. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to user data associated with a program command. Generally, a memory device comprises memory cells which store words of user data as code words. Each code word comprises symbols, and each data state represents one of the symbols. When a cell stores n bits of data, the symbols can have one of $2^n$ possible values. The data states include an erased state and one or more programmed states. A programmed state is a data state to which a memory cell is to be programmed in a programming operation. The symbol or data state which is to be represented by a cell is identified by one or more bits of write data in latches associated with the memory cell. This data state is the assigned data state. Each data state corresponds to a different range of threshold voltages (Vth). Moreover, a programmed state is a state which is reached by programming a memory cell so that its Vth increases from the Vth range of the erased state to a higher Vth range.

Based on its assigned data state, a memory cell will either remain in the erased state or be programmed to a programmed data state. For example, in a one bit per cell memory device, there are two data states including the erased state and a programmed state. In a two-bit per cell memory device, there are four data states including the erased state and three higher data states referred to as the A, B and C data states (see FIG. 8A). In a three-bit per cell memory device, there are eight data states including the erased state and seven higher data states referred to as the A, B, C, D, E, F and G data states (see FIG. 8B). In a four-bit per cell memory device, there are sixteen data states including the erased state and fifteen higher data states. The data states may be referred to as the S0, S1, S2, S3, S4, S5, S6, S7, S8, S9, S10, S11, 512, 513, S14 and S15 data states (see FIG. 8C) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, the use of many different voltages in operating a memory device can be problematic in terms of space, power consumption and performance. For example, many charge pumps could be used, where each charge pump provides a respective output voltage, but this consumes significant space in the memory device. Other approaches involve charging up and then discharging a control line such as a bit line. However, this consumes power unnecessarily and may impose delays in the voltage settling time.

Techniques provided herein address the above and other issues. In one aspect, a voltage is provided as a rectangular waveform in which the duty cycle is varied to provide different effective voltages. These voltages may be applied to various control lines in a memory device such as a word line, bit line and/or source line, in a program, verify, read or erase operation. In some cases, the duty cycle is a function of programming data associated with the memory cell such as an assigned data state or a programming speed category of a memory cell. The programming data is data which is used to guide the programming of a memory cell, and may be stored in latches which are associated with a memory cell. The duty cycle could also be a function of a programming phase or other criterion. The duty cycle can be varied by modifying the duration and separation of the pulses or by pulse counting, in which a specified number of pulses are passed in a time period. Various other features and benefits are described below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Further details of the sense blocks including voltage sources and bit line decoders, are provided further below. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

In one approach, control circuitry 110 is also in communication with source control circuits 127, which includes source line driver 61, source line driver 62, . . . , source line circuit 63. The source line drivers are used to drive different (or the same) voltages on individual source lines. Further details of the source line drivers including voltage sources and source line decoders, are provided further below.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
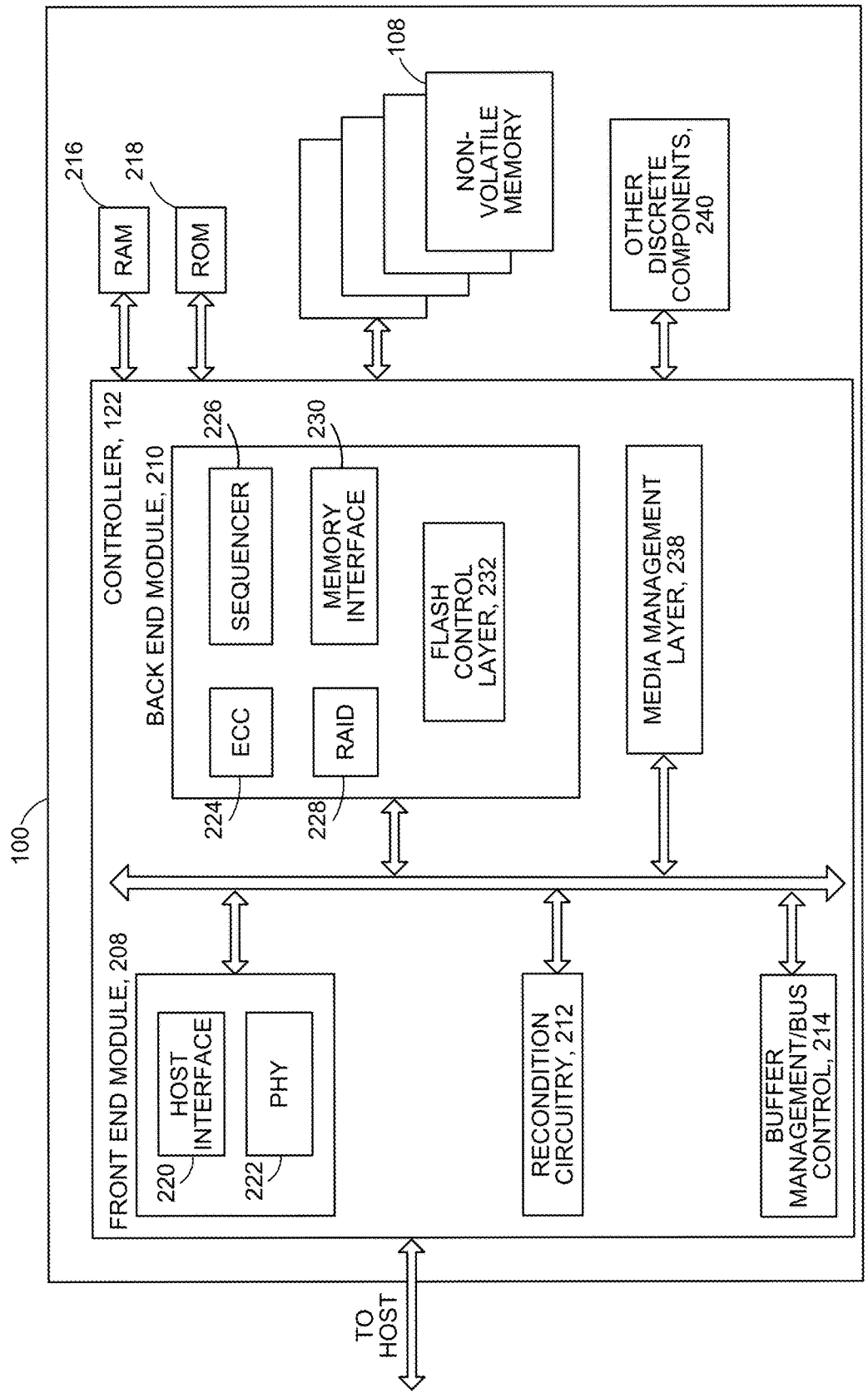
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
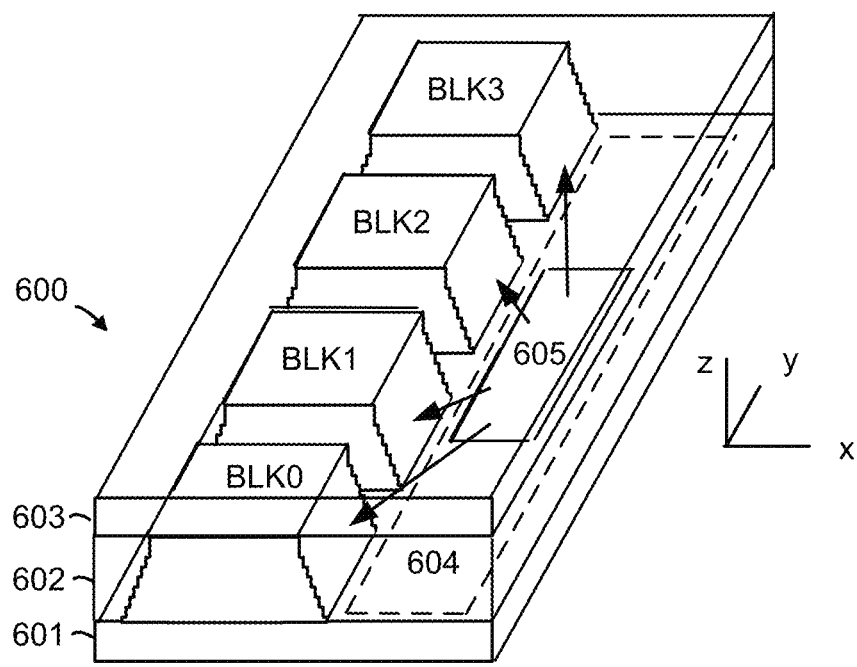
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
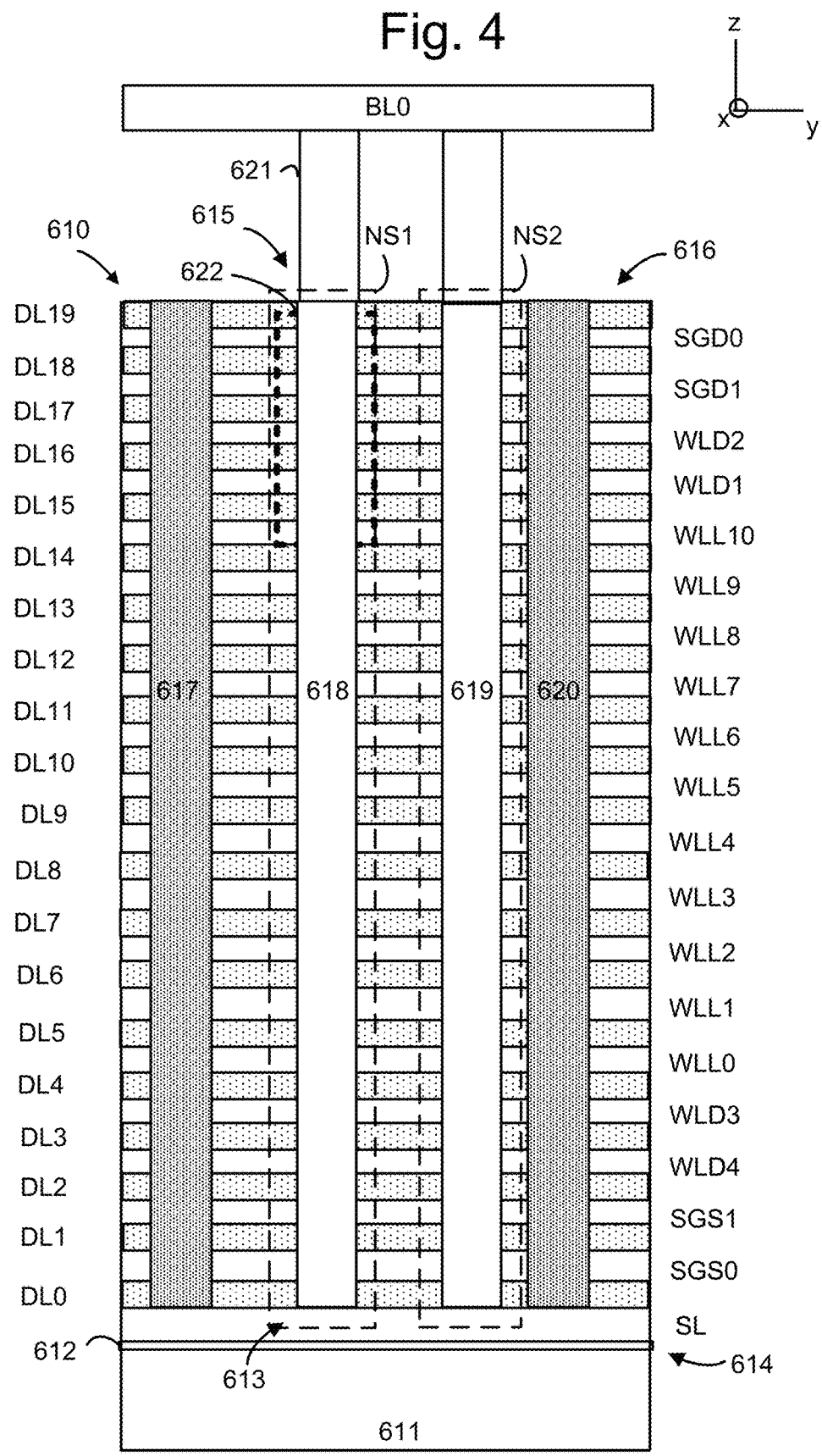
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 5:
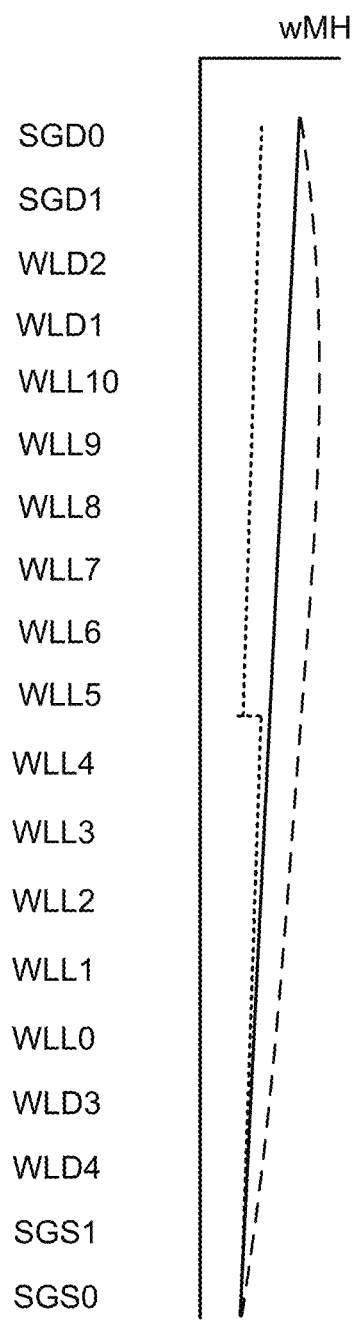
FIG. 5 depicts a plot of memory hole diameter in the stack of FIG. 4.

FIG. 5 depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channel regions 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. See FIGS. 9A1 and 9B. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 7B:
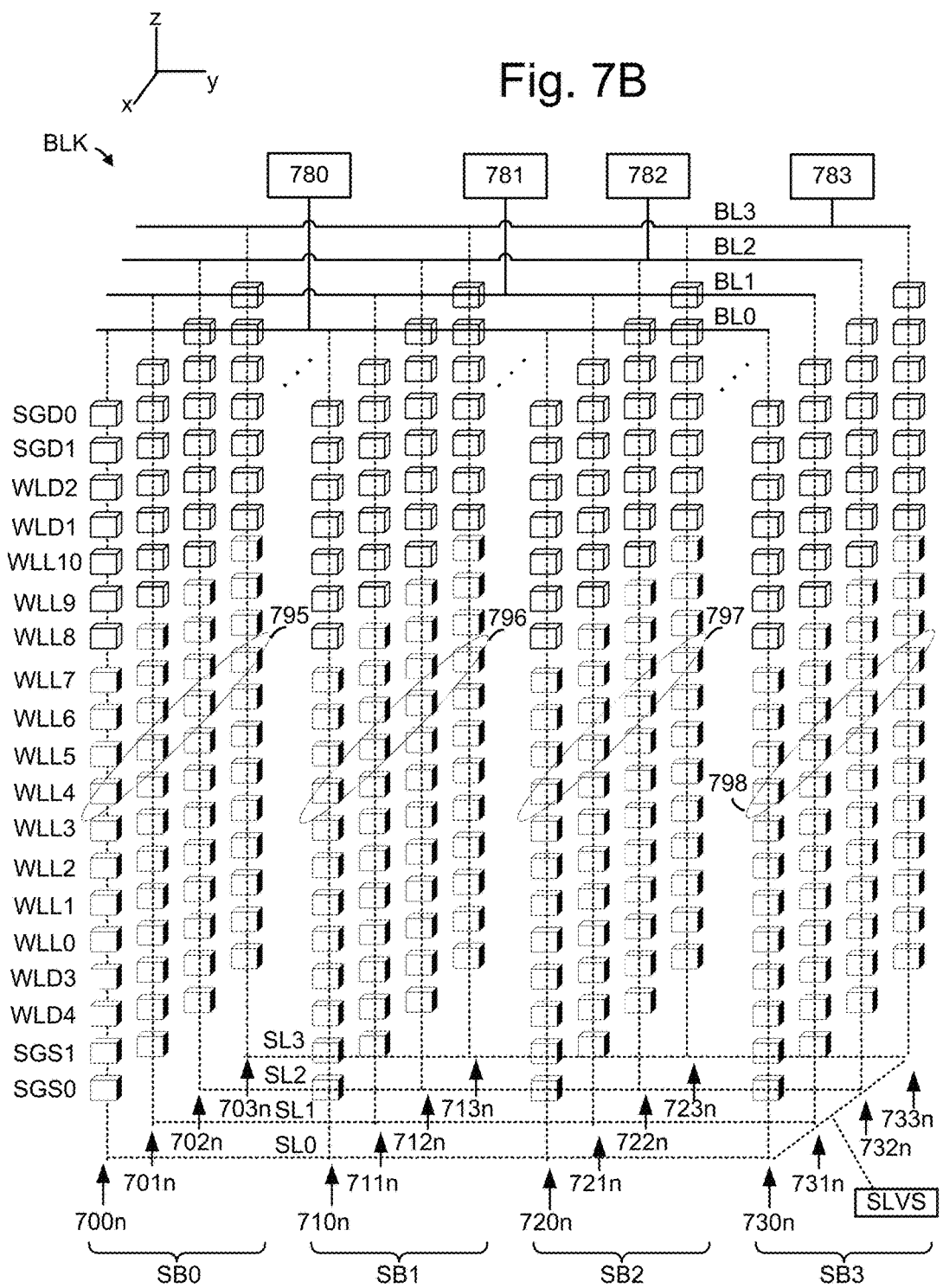
FIG. 7B depicts additional detail of the sub-blocks SB0-SB3 of FIG. 7A, in a configuration where source lines are connected.

FIG. 7B depicts additional detail of the sub-blocks SB0-SB3 of FIG. 7A, in a configuration where source lines are connected. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 connected to WLL4. In this example, the source lines SL0-SL3 are connected and driven at a common voltage by a voltage source, SLVS.

FIG. 7C depicts additional detail of the sub-blocks SB0-SB3 of FIG. 7A, in a configuration where source lines are separate. In this example, the source lines SL0-SL3 are not connected and are driven at respective voltages by the voltage source, SLVS. A programming technique as described in connection with FIG. 9B may be used with this configuration.

FIG. 7D depicts an example memory cell 790. The memory cell comprises a control gate CG which receives a word line voltage Vwl, a drain at a voltage Vd, a source at a voltage Vs and a channel at a voltage Vch.

FIG. 8A depicts an example Vth distribution of memory cells, where four data states are used. The data states are represented by Vth distributions 810, 811, 812 and 813 for the Er (erased), A, B and C states, respectively. The optimum read voltages generally are midway between the Vth distributions of adjacent data states. The read voltages for the A, B and C states are VrA, VrB and VrC, respectively, where VrA>VrA, VrB>VrB and VrC<VrC. During a programming operation, the verify voltages are VvA, VvB and VvC.

Each read voltage demarcates a lower boundary of a data state of a plurality of data states. For example, VrA demarcates a lower boundary of the A state.

An example encoding of bits for each state is 11, 10, 00 and 01, respectively, in the format of upper page (UP) bit/lower page (LP) bit. A LP read may use VrA and VrC and an UP read may use VrB. A lower or upper bit can represent data of a lower or upper page, respectively. Three programmed data states A, B and C are used in addition to the erased state, Er. With these bit sequences, the data of the lower page can be determined by reading the memory cells using read voltages of VrA and VrC. The lower page (LP) bit=1 if Vth<=VrA or Vth>VrC. LP=0 if VrA<Vth<=VrC. The upper page (UP) bit=1 if Vth<=VrB and LP=0 if Vth>VrB. In this case, the UP is an example of a page which can be determined by reading using one read voltage applied to a selected word line. The UP is an example of a page which can be determined by reading using two read voltages applied to a selected word line. The read voltages are depicted as VrA, VrB and VrC, where each of these can represent the first or second read values, whichever is optimal.

FIG. 8B depicts an example Vth distribution of memory cells, where eight data states are used. The Er, A, B, C, D, E, F and G states have Vth distributions 820, 821, 822, 823, 824, 825, 826 and 827, respectively. For the A, B, C, D, E, F and G states, we have verify voltages VvA, VvB, VvC, VvD, VvE, VvF and VvG, respectively, and read voltages VrA, VrB, VrC, VrD, VrE, VrF and VrG, respectively, and example encoding of bits of 111, 110, 100, 000, 010, 011, 001 and 101, respectively. The bit format is: UP/MP/LP.

In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG.

FIG. 8C depicts an example Vth distribution of memory cells, where sixteen data states are used. Programming using four bits per cell (16 levels) can involve lower, lower-middle, upper-middle and upper pages. The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS14 and VrS15 for states S1, S2, S3, S4, S5, S6, S7, S8, S9, S10, S11, S12, S13, S14 and S15, respectively.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

FIG. 9A1 depicts a waveform of an example programming operation, where different verify voltages are applied for verifying different data states. The horizontal axis depicts a program loop (PL) number or time and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906. Different programming phases 915, 916 and 917 can be defined based on the states which are verified, in one approach.

FIG. 9A2 depicts example subsets of cells consistent with the programming phases of FIG. 9A1, in a set of memory cells 949. The cells 950, 951, 952, 953, 954, 955, 956, 957, 958, 959, 960 and 961 have assigned data states of A, F, D, G, A, C, A, E, B, G, F and Er, respectively. The programming phase 915 includes verify operations for the A and B states, as represented by a subset of the cells comprising cells 950, 954, 956 and 958 (boxes with a long dashed line). The programming phase 916 includes verify operations for the A, B and C states, as represented by a subset of the cells comprising cells 950, 954, 955, 956 and 958. The programming phase 917 includes verify operations for the E, F and G states, as represented by a subset of the cells comprising cells 951, 953, 957, 959 and 960 (boxes with a short dashed line).

FIG. 9B depicts a waveform 920 of an example programming operation, where one verify voltage is applied for verifying different data states. A series of program voltages 921, 922, 923, 924, 925 and 926 are applied to a word line. The number of program voltages used to complete programming of a page of data is smaller than in FIG. 9A1. Moreover, a single verify voltage, such as verify voltage 930, can be used to verify different data states concurrently. As a result, programming time is significantly reduced. See further details below, e.g., in connection with FIGS. 11A to 11E, 12A and 12B.

FIG. 9C depicts a plot of example waveforms in a read operation, where a rectangular waveform is used to provide read voltages on a control line. The figure is consistent with the process of FIG. 13J. Vpass is ramped up and then back down separately during the read voltages of each of the lower, middle and upper pages as depicted by plots 940, 941 and 942, respectively. This example is for an eight-state memory device. The example can be modified for fewer states (e.g., four states and two pages) or additional states (e.g., sixteen states and four pages).

For the first page, the A and E states are read using a read voltage waveform 940a having voltages of VrA and VrE, respectively. For the second page, the B, D and F states are read using a read voltage waveform 941a having voltages of VrB, VrD and VrF, respectively. For the third page, the C and G states are read using a read voltage waveform 942a having voltages of VrC and VrG, respectively. A rectangular waveform can be used to provide the read voltages.

FIG. 10A depicts threshold voltages distributions during an example programming operation consistent with the waveform of FIG. 9A1. The distribution is the same as in FIG. 8B where states S0, S1, S2, S3, S4, 55, S6 and S7 (with Vth distributions 1001, 1002, 1003, 1004, 1005, 1006, 1007 and 1008, respectively) correspond to states Er, A, B, C, D, E, F and G, respectively. The programmed states A, B, C, D, E, F and G have verify voltages of VvS1, VvS2, VvS3, VvS4, VvS5, VvS6 and VvS7, respectively. The distributions 1010, 1011, 1012 and 1013 are seen after first, second, third and fourth program voltages, respectively. The distributions which are seen after subsequent program voltages are not depicted for simplicity. Generally, the Vth distribution widens relative to the distribution of the erased state because the memory cells have different programming speeds. For a given program voltage, different cells will experience different increases in Vth. The distributions 1011 and 1012 include some cells which have the S1 state as their assigned state and have completed programming. The distribution 1013 includes some cells which have the S1 or S2 state as their assigned state and have completed programming.

FIG. 10B1 depicts the Vth distribution 1013 of FIG. 10A showing how memory cells can be assigned to one of two program speed categories. This example divides the distribution 1013 into two parts 1013a and 1013b to define two categories of programming speed. For cells which have a Vth in the part 1013a or 1013b, a bit of "0" or "1," respectively, may be assigned which represent a slow or fast programming speed category, respectively. The category represented by Vth part 1013a and bit "0" is a relatively lower programming speed category among a plurality of programming speed categories.

Figure 16:
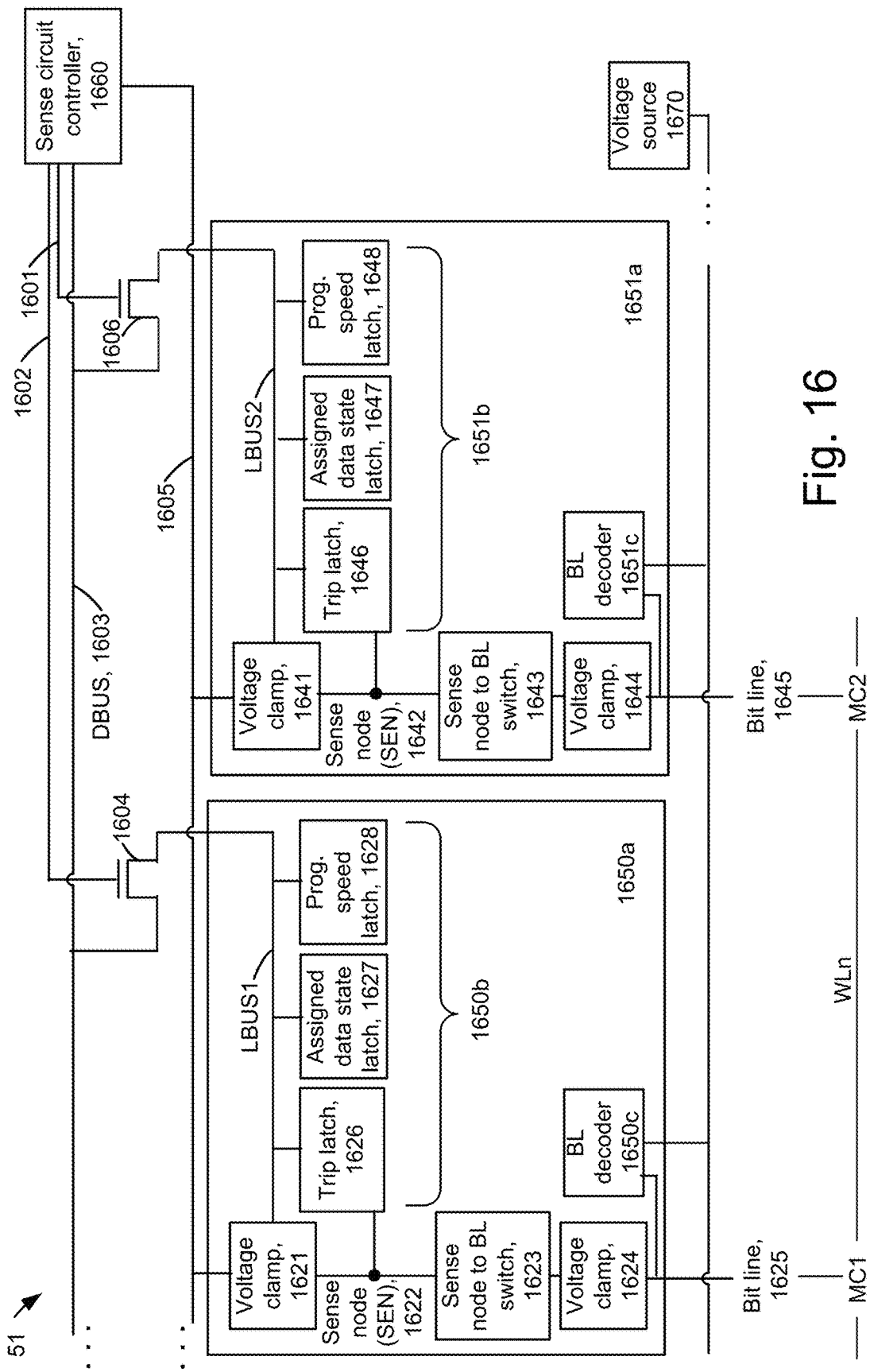
FIG. 16 depicts another example block diagram of a sense block 51 in the column control circuitry of FIG. 1.

This is an example of programming speed data which may be stored in the latches 1628 and 1648 of FIG. 16. Memory cells which have a Vth<=VvS2 are considered to be slow programming and memory cells which have a Vth>VvS2 are considered to be fast programming. This example uses VvS2 as a read voltage to measure the programming speed to avoid the need for an extra sensing operation. Normally, sense results are not obtained for cells other than the S2 state cells during VvS2. However, with the techniques described herein for measuring programming speed, sense results can be obtained for cells of all (or some) programmed states during VvS2, as an example. Another option is to measure the programming speed using an extra sensing operation, where the read voltage is different than a verify voltage. More than two speed categories could be used as well by sensing the cells using more than one read voltage.

Based on the programming speed which is determined early in the program operation or pass, voltages of the bit line and/or source line can be adjusted to cause the cells to have a more uniform programming speed later in the program operation or pass. This results in narrower Vth distributions. Specifically, the faster cells can be slowed down, typically by elevating the voltages of the bit line and/or source line compared to the slower cells.

Memory cells can also be assigned to categories of programming speed using the waveform of FIG. 9B.

FIG. 10B2 depicts the Vth distribution 1013 of FIG. 10A showing how memory cells can be assigned to one of four program speed categories. This example divides the distribution 1013 into four parts 1015a, 1015b, 1015c and 1015d to define four categories of programming speed. For cells which have a Vth in the part 1015a, 1015b, 1015c and 1015d, bits of "00," "01," "10" or "11," respectively, may be assigned which represent a slowest, moderately slow, moderately fast or fastest programming speed category, respectively.

FIG. 10C depicts a plot of bit line voltage (Vbl) and/or source line voltage (Vsl) versus program loop number, showing different voltages based on programming speed category, consistent with the Vth distribution of FIG. 10B1 and the programming waveform of FIG. 9B. In this example, only the S4 state cells are depicted for simplicity. However, the Vbl/Vsl can be adjusted based on the programming speed category of cells of other data states similarly. During program loops 1-3, all of the S4 cells receive a voltage of V_S4 (e.g., 2.4 V consistent with FIG. 12A). During program loop 3, the S4 cells are classified into program speed categories of fast or slow. Subsequently, in program loops 4-6, the slow S4 cells continue to receive V_S4 while the fast S4 cells receive a higher voltage of V_S4 fast (e.g., 2.6 V). The higher voltage may be 0.2 V higher for all data states, as an example.

Figure 10D:
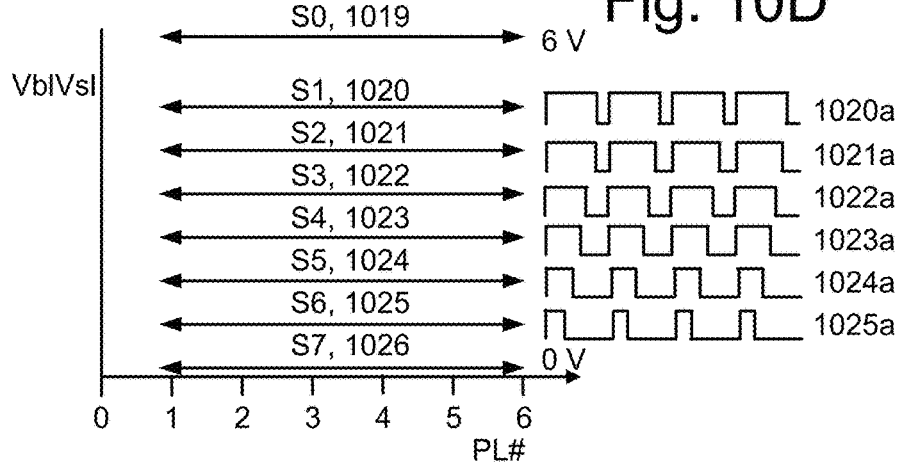
FIG. 10D depicts an example plot of Vbl and/or Vsl versus program loop number, showing different voltages based on assigned data state, consistent with the Vth distribution of FIG. 10A, the programming waveform of FIG. 9B, and the table of FIG. 12A, where Vbl and/or Vsl are fixed for each data state.
Figure 10E:
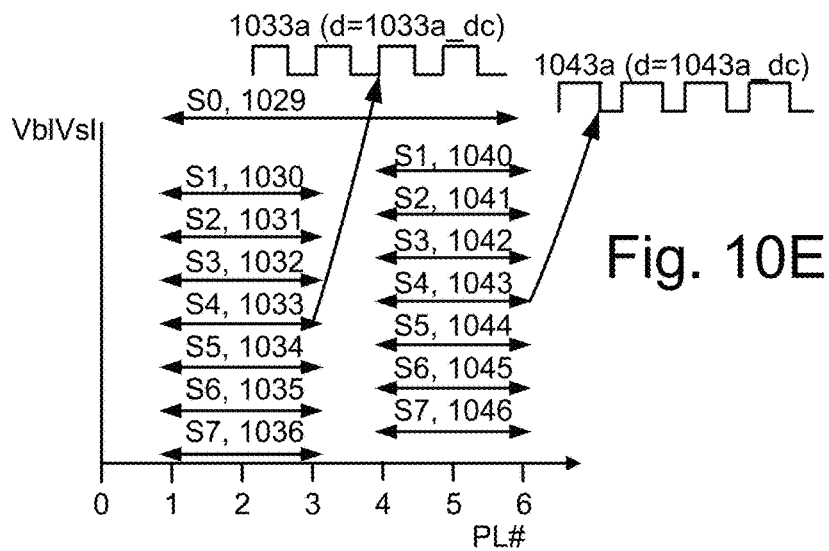
FIG. 10E depicts an example plot of Vbl and/or Vsl versus program loop number, showing different voltages based on assigned data state, consistent with the Vth distribution of FIG. 10A, the programming waveform of FIG. 9B, and the table of FIG. 12A where Vbl and/or Vsl have first and second values for each data state as a function of program loop number, and the second value is higher than the first value by a common amount for the different data states.

V_S4 and V_S4 fast may be provided by the waveforms 1033a and 1043a respectively, of FIG. 10E.

FIG. 10D depicts an example plot of Vbl and/or Vsl versus program loop number, showing different voltages based on assigned data state, consistent with the Vth distribution of FIG. 10A, the programming waveform of FIG. 9B, and the table of FIG. 12A, where Vbl and/or Vsl are fixed for each data state. Progressively decreasing voltages are represented by lines 1019 to 1026 for cells of states S0 to S7, respectively. The voltages of the lines 1020 to 1025 are provided using waveforms 1020a to 1025a, respectively, with progressively shorter duty cycles. In one option, a steady state voltage of 0 V or 6 V is provided for S7 or S0 cells, respectively.

FIG. 10E depicts an example plot of Vbl and/or Vsl versus program loop number, showing different voltages based on assigned data state, consistent with the Vth distribution of FIG. 10A, the programming waveform of FIG. 9B, and the table of FIG. 12A where Vbl and/or Vsl have first and second values for each data state as a function of program loop number, and the second value is higher than the first value by a common amount for the different data states. The program loops 1-3 represent one subset of program voltages (e.g., program voltages 921-923 in FIG. 9B) and program loops 4-6 represent another subset of program voltages (e.g., program voltages 924-926 in FIG. 9B). Vbl/Vsl are represented by lines 1030 to 1036 in program loops 1-3 and by lines 1040 to 1046 in program loops 4-6 for cells of the programmed states S1 to S7, respectively. The different voltages can be provided using waveforms with different duty cycles. For example, waveforms 1033a and 1043a which have duty cycles of 1033a_dc and 1043a_dc (where 1033a_dc<1043a_dc) can provide the voltages represented by the lines 1033 and 1043, respectively. Vbl/Vsl (e.g., 6 V) is represented by line 1029 in each program loop for cells of state S0.

This example shows how Vbl/Vsl can be increased toward the end of the programming operation to prove an additional slowdown of the cells which may result in a narrower Vth distribution.

Advantageously, the same DC voltage source can be used to provide the various voltages represented by the lines 1029-1036 and 1040-1046. Further, the voltages represented by the lines 1040-1046 can replace the voltages represented by the lines 1030-1036 so there is no change in the number of waveforms which are provided to a decoder for each bit line or source line. Instead, one set of waveforms with respective duty cycles replaces another set of waveforms with respective duty cycles.

Figure 10F:
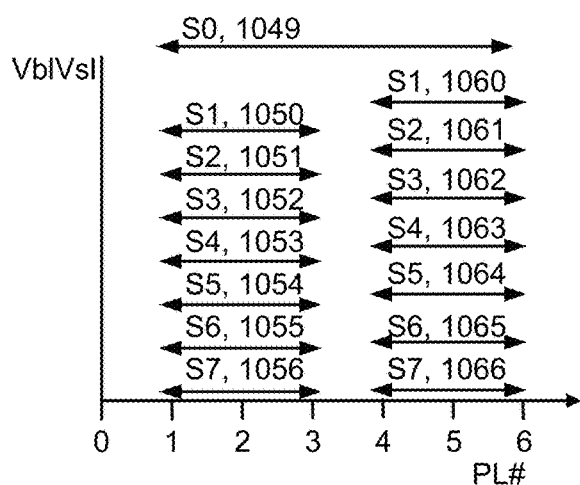
FIG. 10F depicts an example plot of Vbl and/or Vsl versus program loop number, showing different voltages based on assigned data state, consistent with the Vth distribution of FIG. 10A, the programming waveform of FIG. 9B, and the table of FIG. 12A, where Vbl and/or Vsl have first and second values for each data state as a function of program loop number, and the second value is higher than the first value by different amounts for the different data states.

FIG. 10F depicts an example plot of Vbl and/or Vsl versus program loop number, showing different voltages based on assigned data state, consistent with the Vth distribution of FIG. 10A, the programming waveform of FIG. 9B, and the table of FIG. 12A, where Vbl and/or Vsl have first and second values for each data state as a function of program loop number, and the second value is higher than the first value by different amounts for the different data states. The program loops 1-3 represent one subset of program voltages (e.g., program voltages 921-923 in FIG. 9B) and program loops 4-6 represent another subset of program voltages (e.g., program voltages 924-926 in FIG. 9B). Vbl/Vsl are represented by lines 1050 to 1056 in program loops 1-3 and by lines 1060 to 1066 in program loops 4-6 for cells of states S1 to S7, respectively. The different voltages can be provided using waveforms with different duty cycles. This example shows how Vbl/Vsl can be increased by different amounts for different data states toward the end of the programming operation to prove an additional slowdown of the cells which may result in a narrower Vth distribution. The Vbl/Vsl can be increased by a relatively higher amount for relatively lower data states to provide an extra slow down for these states. This is appropriate because these cells are already close to their final Vth and many will have already completed programming.

In this example, Vbl/Vsl is not increased for cells of the highest data state, S7, but is fixed at 0 V.

FIGS. 10E and 10F are example programming operations which can be performed by an apparatus which comprises: means for applying a series of program voltages (921-926) to a set of memory cells (949), the series of program voltages comprising one subset of program voltages (921-923) followed by another subset of program voltages (924-926); means for pulsing a direct current voltage at one duty cycle (1033_dc) to provide one waveform (1033) during the one subset of program voltages; means for applying the one waveform to the set of memory cells during the one subset of program voltages; means for pulsing the direct current voltage at another duty cycle (1043a_dc) in place of the one duty cycle to provide another waveform (1043a) during the another subset of program voltages; and means for applying the another waveform to the set of memory cells during the another subset of program voltages.

Figure 10G:
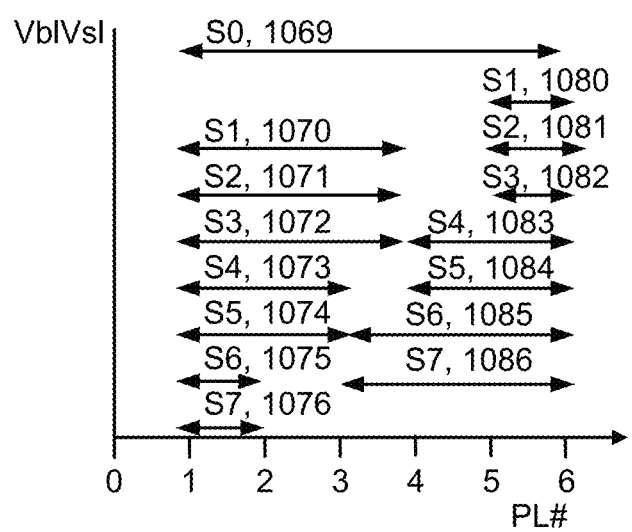
FIG. 10G depicts an example plot of Vbl and/or Vsl versus program loop number, showing different voltages based on assigned data state, consistent with the Vth distribution of FIG. 10A, the programming waveform of FIG. 9B, and the table of FIG. 12A where Vbl and/or Vsl have first and second values for each data state as a function of program loop number, and the voltages changes at different program loops based on the data state.

FIG. 10G depicts an example plot of Vbl and/or Vsl versus program loop number, showing different voltages based on assigned data state, consistent with the Vth distribution of FIG. 10A, the programming waveform of FIG. 9B, and the table of FIG. 12A where Vbl and/or Vsl have first and second values for each data state as a function of program loop number, and the voltages change at different program loops based on the data state. In contrast to the examples of FIGS. 10E and 10F, the transition on Vbl/Vsl does not have to occur at the same program loop for all data states. In this example, the transition occurs at a relatively lower program loop for relative higher data states. An optimum program loop for the transition can be set for cells of each data state.

For example, cells of state S7 have one voltage (line 1076) during program loops 1 and 2, and another voltage (line 1086) during program loops 3-6. Cells of state S6 have one voltage (line 1075) during program loops 1 and 2, and another voltage (line 1085) during program loops 3-6. Cells of state S5 have one voltage (line 1074) during program loops 1-3, and another voltage (line 1084) during program loops 4-6. Cells of state S4 have one voltage (line 1073) during program loops 1-3, and another voltage (line 1083) during program loops 4-6. Cells of state S3 have one voltage (line 1072) during program loops 1-4, and another voltage (line 1082) during program loops 5 and 6. Cells of state S2 have one voltage (line 1071) during program loops 1-4, and another voltage (line 1081) during program loops 5 and 6. Cells of state S1 have one voltage (line 1070) during program loops 1-4, and another voltage (line 1080) during program loops 5 and 6.

Vbl/Vsl (e.g., 6 V) is represented by line 1069 in each program loop for cells of state S0.

Another advantage of this approach is that Vbl/Vsl levels may be re-used. For example, lines 1075 and 1086 may represent the same voltage, lines 1074 and 1085 may represent the same voltage, lines 1073 and 1084 may represent the same voltage, lines 1072 and 1083 may represent the same voltage, lines 1071 and 1082 may represent the same voltage, and lines 1070 and 1081 may represent the same voltage. In this case, the total number of different voltages provides at the bit lines or source lines does not increase. In another option, one or more additional voltages are provided using rectangular waveforms.

FIG. 11A to 11E depict threshold voltages distributions during an example programming operation consistent with the waveform of FIG. 9B.

Figure 11A:
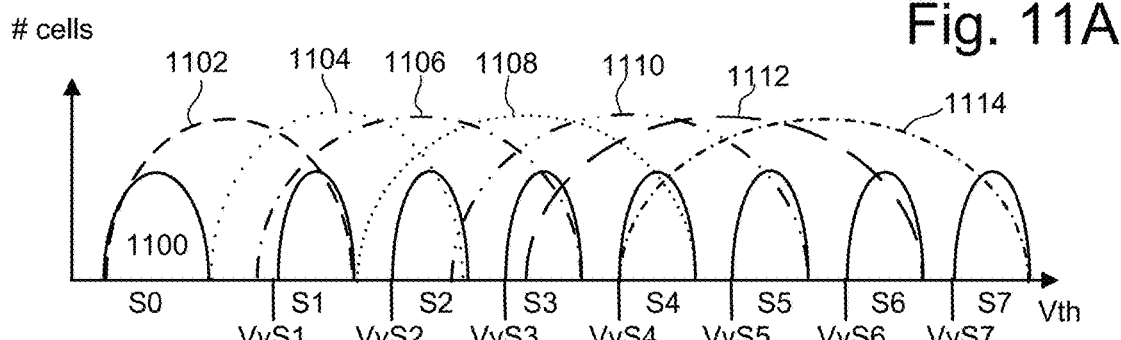
FIG. 11A to 11E depict threshold voltages distributions during an example programming operation consistent with the waveform of FIG. 9B.

FIG. 11A depicts the results of applying the first program voltage 921 in FIG. 9B. FIG. 11A shows the target or final Vth distributions in solid lines and the current Vth distributions in dashed lines. Vth distributions 1102, 1104, 1106, 1108, 1110, 1112 and 1114 are for memory cells being programmed to assigned data states S1, S2, S3, S4, S5, S6 and S7, respectively. The Vth distribution 1100 is for the erased state S0. Note that the height/magnitude of the Vth distributions 1102, 1104, 1106, 1108, 1110, 1112 and 1114 is somewhat exaggerated to make the drawings easier to read.

Figure 11B:
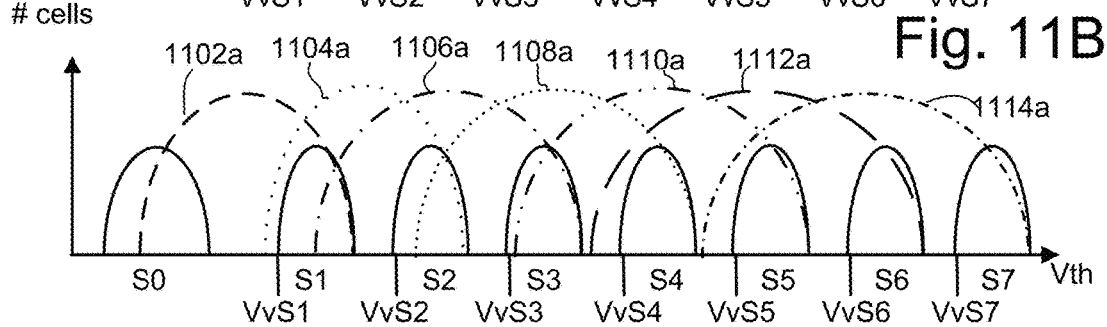

FIG. 11B depicts the results of applying the second program voltage 922 in FIG. 9B. Vth distributions 1102*a*, 1104*a*, 1106*a*, 1108*a*, 1110*a*, 1112*a* and 1114*a* are for memory cells being programmed to assigned data states S1, S2, S3, S4, S5, S6 and S7, respectively.

Figure 11C:
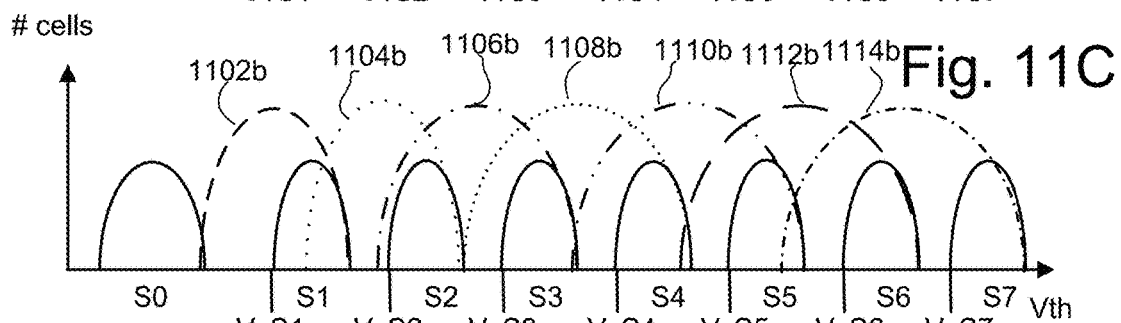

FIG. 11C depicts the results of applying the third program voltage 923 in FIG. 9B. As depicted, Vth distributions 1102*b*, 1104*b*, 1106*b*, 1108*b*, 1110*b*, 1112*b* and 1114*b* are for memory cells being programmed to assigned data states S1, S2, S3, S4, S5, S6 and S7, respectively.

Figure 11D:
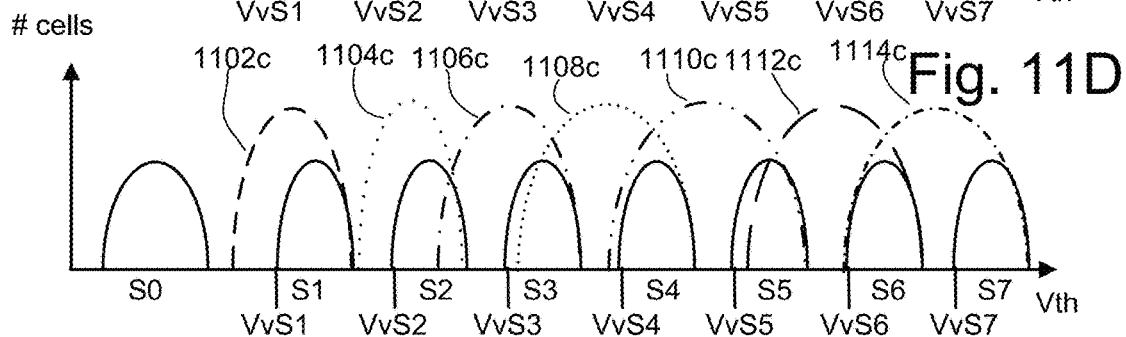

FIG. 11D depicts the results of applying the fourth program voltage 924 in FIG. 9B. As depicted, Vth distributions 1102*c*, 1104*c*, 1106*c*, 1108*c*, 1110*c*, 1112*c* and 1114*c* are for memory cells being programmed to assigned data states S1, S2, S3, S4, S5, S6 and S7, respectively.

Figure 11E:
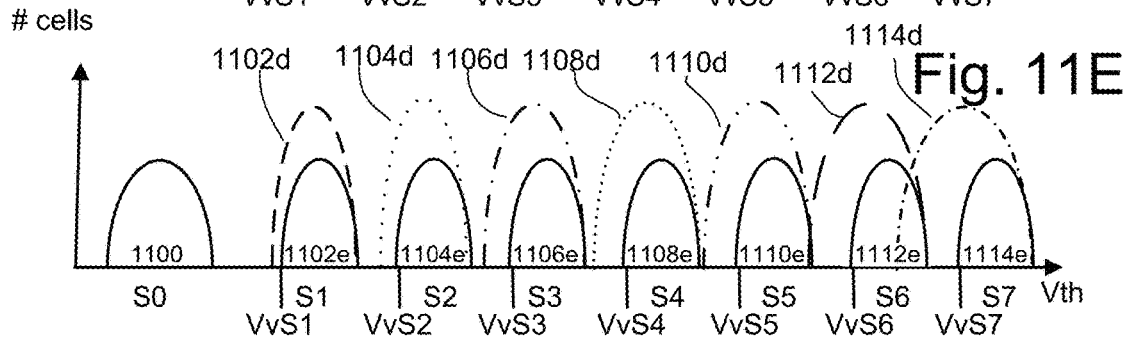

FIG. 11E depicts the results of applying the fifth program voltage 925 in FIG. 9B. As depicted, Vth distributions 1102*d*, 1104*d*, 1106*d*, 1108*d*, 1110*d*, 1112*d* and 1114*d* are for memory cells being programmed to assigned data states S1, S2, S3, S4, S5, S6 and S7, respectively. After the sixth program voltage 926, the Vth distributions 1102*e*, 1104*e*, 1106*e*, 1108*e*, 1110*e*, 1112*e* and 1114*e* are reached.

In this programming operation, the bit line and/or source line voltages are controlled for each cell based on the assigned data state of the cell. For each assigned data state, some of the cells will complete programming after the first program voltage. These are the fast programming cells. The slower programming cells will complete programming as the additional program voltages are applied.

FIG. 12A is a table that identifies one embodiment of data dependent source line voltages and bit line voltages for programming, verifying and reading, consistent with FIGS. 9B and 11A to 11E. The programming operation of FIG. 9B includes applying data dependent voltages to individual source lines and bit lines for programming. The column labelled "State" depicts the assigned data state.

The columns labelled "Program" identify the data dependent voltages applied to individual source lines and bit line, respectively, during a program voltage on the control gate or word line. In this example, the source line voltage and bit line voltage are the same for each data state. For example, for memory cells being programmed to state S1, S2, S3, S4, S5, S6 or S7, the source line and bit line voltages are 4.8 V, 4.0 V, 3.2 V, 2.4 V, 1.6 V, 0.8 V and 0 V, respectively. For memory cells which remain in the erased state S0, the source line and bit line voltages are 6.0 V. Once a decision has been made based on one of the verify operations to lock out any particular cell from further programming (due to the Vth of a cell exceeding its verify voltage), then from that point on the cell/column will be treated the same way as an erased cell. That is, it will be locked out of further programming by boosting or other methods that inhibit programming.

Because memory cells being programmed to lower states receive higher source line voltages and bit line voltages, the programming pulses will cause the Vth of these memory cells to increase at a lower rate, consistent with FIG. 11A to 11E. Similarly, because memory cells being verified for lower states receive higher source line voltages and bit line voltages, the verification test can use the same single verification voltage on the selected word line.

The columns labelled "Inhibit" identify voltages applied to individual bit line and source lines of memory cell which have an inhibit, e.g., lockout, status. This includes cells which have completed programming and are inhibited from further programming. This also includes erased state cells. Note that the numerical values listed in FIG. 12A are examples, and other values can also be used.

The columns labelled "Verify" identify the data dependent voltages applied to individual source lines and bit line, respectively, during a verify voltage on the control gate or word line. For example, for memory cells being programmed to state S1, S2, S3, S4, S5, S6 or S7, the source line and bit line voltages are 4.8 V and 5.3 V, 4.0 V and 4.5

V, 3.2 V and 3.7 V, 2.4 V and 2.9 V, 1.6 V and 2.1 V, 0.8 V and 1.3 V and 0 V and 0.5 V, respectively.

The columns labelled "Read" identify the data dependent voltages applied to individual source lines and bit line, respectively, during a read voltage on the control gate or word line. In this example, the bit line voltage is 0 V and the source line voltage is 0.5 V for cells of all data states.

FIG. 12B is a table that provides example voltages for the drain side select signal (VSGD), source side select signal (VSGS), selected word line (WL N), unselected word lines on the source side of the selected word line (WL#≤N−1), and unselected word lines on the drain side of the selected word line (WL#≥N+1). For example, during verify operations the selected word line receives one voltage pulse at 5.2 V, while the unselected word lines on the drain side receive 6 V, the source side select signal and the drain side select signal receive 8 V, and while the unselected word lines on the source side receive 12 V. Other voltages than 6 V can be applied, and engineering optimization will determine the best voltages to apply to unselected word lines, various source side select gates, and various drain side select gates during both verify and program operations. During programming, the selected word line receives Vpgm (see FIG. 9B), while the unselected word lines on the drain side and source side receive 9 V, and the source side select signal and the drain side select signal receive 6 V. During reading, the selected word line receive a control gate read voltage, Vcgr (i.e., Vr1, Vr2, Vr3, Vr4, Vr5, Vr6 or Vr 7), the source side select signal receive 4 V, the drain side select signal receives 4 V, and all unselected word lines receive 7 V. Note that the numerical values listed in FIG. 12 are examples, and other values can also be used.

Figure 13A:
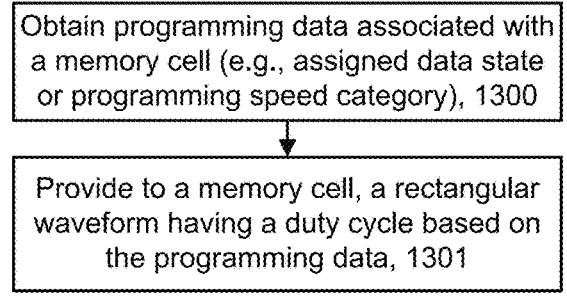
FIG. 13A depicts an example process for providing a rectangular waveform to a memory cell.

FIG. 13A depicts an example process for providing a rectangular waveform to a memory cell. Step 1300 includes obtaining programming data associated with a memory cell, such as assigned data state or programming speed category. For example, the data may be read from one or more latches associated with the memory cell. Step 1301 includes providing a rectangular waveform to the memory cell, where a duty cycle of the rectangular waveform is based on the programming data associated with the memory cell. See FIGS. 14A, 14B and 20 for examples of rectangular waveforms. A rectangular waveform comprises a voltage which periodically varies between two or more levels. For example, the rectangular waveform of FIG. 14A alternates between a lower voltage VL and a higher voltage VH in a period T. A rectangular waveform has a duty cycle of between 0% and 100%. A rectangular waveform with a duty cycle of 50% is a square wave. A rectangular waveform may also be referred to as a pulse wave which comprises a series of pulses. VH is used for a time duration of Th and VL is used for a time duration of Tl, where Th+Tl=T. The duty cycle of this rectangular waveform is Th/T and may be expressed as a percentage by 100%×Th/Tl. The rectangular waveform has an effective voltage of (VH−VL)×duty cycle. If VL=0 V, the effective voltage is VH×duty cycle. The duty cycle is a ratio of the total time the one or more higher voltages are applied within a repeating period of the waveform.

In another example, the rectangular waveform of FIG. 14B alternates between a lower voltage VL, a first higher voltage VH1 and a second higher voltage VH2 in a period T. The period T encompassed both higher voltages. VH2 is used for a time of Th2, followed by VL for a time of Tl1, followed by VH1 for a time of Th1, followed by VL for a time of Tl2, where Th2+Tl1+Th2+Tl2=T. The duty cycle of this rectangular waveform is (Th2+Th1)/T. The rectangular waveform has an effective voltage of (VH2×Th2+VH1×Th1)/T, assuming VL=0 V. The example rectangular waveforms have a squared off profile due to step changes in the voltage. Various other rectangular waveforms and are possible as well.

Figure 13B:
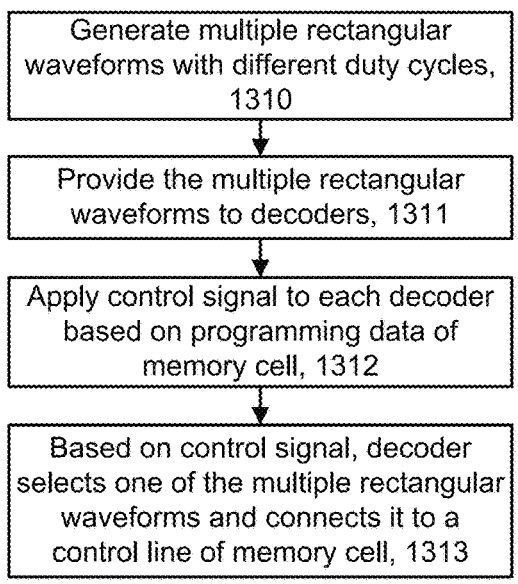
FIG. 13B depicts an example process consistent with FIG. 13A for providing a rectangular waveform to a memory cell by selecting one of multiple rectangular waveforms with different duty cycles.

FIG. 13B depicts an example process consistent with FIG. 13A for providing a rectangular waveform to a memory cell by selecting one of multiple rectangular waveforms with different duty cycles. Step 1310 includes generating multiple rectangular waveforms with different duty cycles. For example, see FIGS. 18A and 18B. Step 1311 includes providing the multiple rectangular waveforms to decoders, where a separate decoder may be associated with each memory cell. See, e.g., FIG. 19A. Step 1312 includes applying a control signal to each decoder based on programming data associated with the memory cell. Step 1313 includes, based on the control signal, using the decoder to select one of the multiple rectangular waveforms and connect it to a control line of the memory cell. The control line could be a word line, bit line or source line, for instance.

Figure 13C:
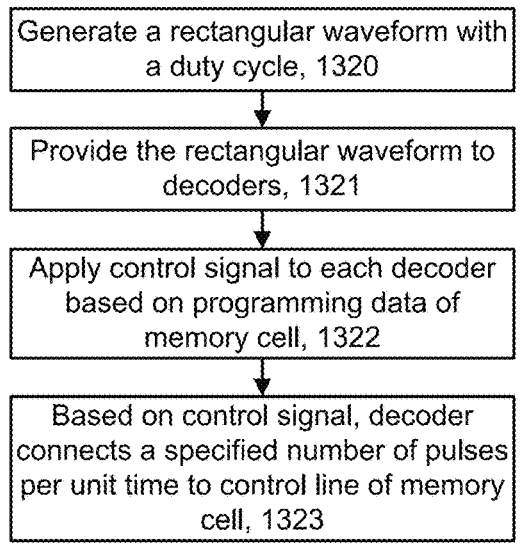
FIG. 13C depicts an example process consistent with FIG. 13A for providing a rectangular waveform to a memory cell by passing a specified number of pulses per time period to a control line of a memory cell.

FIG. 13C depicts an example process consistent with FIG. 13A for providing a rectangular waveform to a memory cell by passing a specified number of pulses per time period to a control line of a memory cell. Step 1320 includes generating a rectangular waveform with a duty cycle. See, e.g., FIGS. 20 and 21A. Step 1321 includes providing the rectangular waveform to decoders, where a separate decoder may be associated with each memory cell. See, e.g., FIG. 21B. Step 1322 includes applying a control signal to each decoder based on programming data associated with the memory cell. Step 1323 includes, based on the control signal, using the decoder to pass a specified number of pulses per time period to a control line of the memory cell.

Figure 13D:
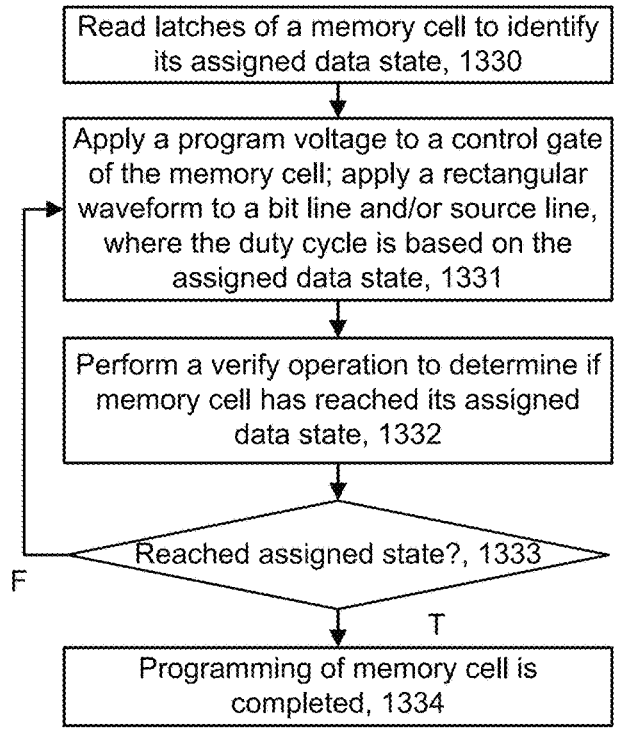
FIG. 13D depicts an example programming operation for a memory cell consistent with FIG. 13A in which a rectangular waveform is applied to a bit line and/or source line based on an assigned data state while a program voltage is applied to a control gate of the memory cell.

FIG. 13D depicts an example programming operation for a memory cell consistent with FIG. 13A in which a rectangular waveform is applied to a bit line and/or source line based on an assigned data state while a program voltage is applied to a control gate of the memory cell. A program voltage such as in FIG. 9A1 or 9B may be used, for instance. Step 1330 includes reading latches of a memory cell to identify its assigned data state. See, e.g., FIGS. 15 and 16. Step 1331 includes applying a program voltage to a control gate of the memory cell while applying a rectangular waveform to a bit line and/or source line of the memory cell, where the duty cycle is based on the assigned data state. Step 1332 includes performing a verify operation to determine if the memory cell has reached its assigned data state. At a decision step 1333, if the memory cell has reached its assigned state, step 1334 is reached where the programming of the memory cell is completed. If the decision step 1333 is false, step 1331 is repeated with the next program voltage and rectangular waveform. One example of this programming operation involves using the rectangular waveform to slow down cells with relatively high data states.

FIG. 13E depicts an example programming operation similar to FIG. 13D but for a set of memory cells. A program voltage such as in FIG. 9A1 or 9B may be used, for instance. Step 1340 includes reading latches of each memory cell in a set of memory cells connected to a word line to identify each memory cell's assigned data state or lockout status. The assigned data state is obtained for a cell which has not yet completed programming. Such a cell has a program or non-lockout status. The lockout status is for a cell which has completed programming or which is assigned to the erased state. Step 1341 includes applying a program voltage to the word line while applying an inhibit voltage to bit lines and/or source lines of memory cells with a lockout status and applying a rectangular waveform to each bit line and/or source line of memory cells with a program status, where the duty cycle is based on the assigned data state. Step 1342 includes performing a verify operation to determine if each memory cell has reached its assigned data state. Step 1343 sets a lockout status in the latches for memory cells which reach their assigned state. At a decision step 1344, if the memory cells have reached their assigned states, step 1345 is reached where the programming of the set of memory cells is completed. If the decision step 1344 is false, step 1340 is repeated to again read the latches.

FIG. 13F depicts an example programming operation for a set of memory cells consistent with FIG. 13A in which a rectangular waveform is applied to bit lines and/or source lines based on a programming while a program voltage is applied to a control gate of the memory cells. FIGS. 10A and 10B gave one example of how programming speed can be measured for memory cells during initial programming. Step 1350 includes performing initial programming of a set of memory cells connected to a word line. For example, this could involve one or more program-verify iterations or program loops. Step 1351 includes performing sensing to assign each memory cell to a programming speed category, and storing data in latches which identifies the programming speed category. Optionally, a lockout status is set in the latches for cells which have completed programming. Step 1352 includes reading the latches to determine the lockout status or programming speed category.

Step 1353 includes applying a program voltage to the word line while applying an inhibit voltage to bit lines and/or source lines of memory cells with a lockout status and applying a rectangular waveform to each bit line and/or source line of memory cells with a program status, where the duty cycle is based on the programming speed category. Step 1354 includes performing a verify operation to determine if each memory cell has reached its assigned data state. Step 1355 sets a lockout status in the latches for memory cells which reach their assigned state. At a decision step 1356, if the memory cells have reached their assigned states, step 1357 is reached where the programming of the set of memory cells is completed. If the decision step 1356 is false, step 1352 is repeated to again read the latches.

Figure 13G:
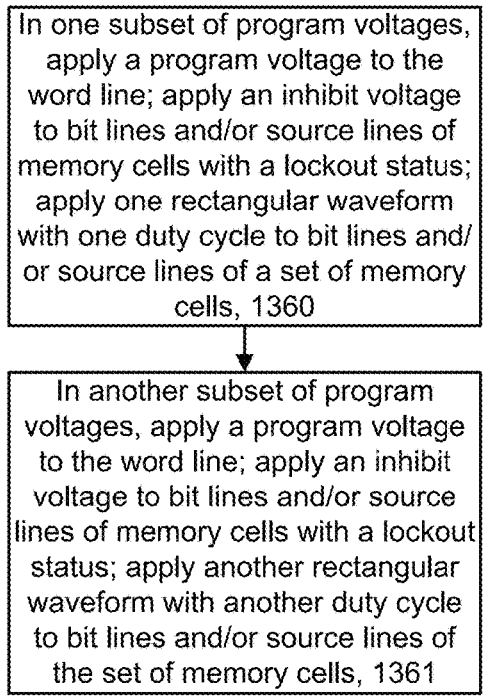
FIG. 13G depicts an example programming operation for a set of memory cells as an alternative or addition to FIG. 13A in which one rectangular waveform is applied to one subset of memory cells during one subset of program voltages, and another rectangular waveform is applied to another subset of memory cells during another subset of program voltages.

FIG. 13G depicts an example programming operation for a set of memory cells as an alternative or addition to FIG. 13A in which one rectangular waveform is applied to one subset of memory cells during one subset of program voltages, and another rectangular waveform is applied to another subset of memory cells during another subset of program voltages. FIGS. 10C, 10E and 10F provided an example of different programming phases, where each phase included a subset of program voltages. For example, one phase includes program loops 1-3 and another phase include program loops 4-6. The Vbl/Vsl is set based on the phase.

One option is to use rectangular waveforms with different duty cycles to provide the different voltages.

Step 1360 includes, in one subset of program voltages, apply a program voltage to the word line while applying an inhibit voltage to bit lines and/or source lines with a lockout status, and applying one rectangular waveform with one duty cycle to bit lines and/or source lines of a set of memory cells. Verify operations are performed after the program voltages. The one rectangular waveform has one effective voltage which allows programming of the cells having a program status at a relatively fast rate, in one approach.

Step 1361 includes, in another subset of program voltages, apply a program voltage to the word line while applying an inhibit voltage to bit lines and/or source lines with a lockout status, and applying another rectangular waveform with another duty cycle to bit lines and/or source lines of another subset of memory cells. The another rectangular waveform has an effective voltage which allows programming of the cells having a program status an at a slowed rate, in one approach.

For example, in FIG. 9B, the one subset of program voltages may include program voltages 921 to 923 and another subset of program voltages may include program voltages 924 to 926.

As another example, in FIG. 9A1, the programming phases 915, 916 and 917 comprises program voltages 901 and 902, 903 and 904, and 906, respectively.

Figure 13H:
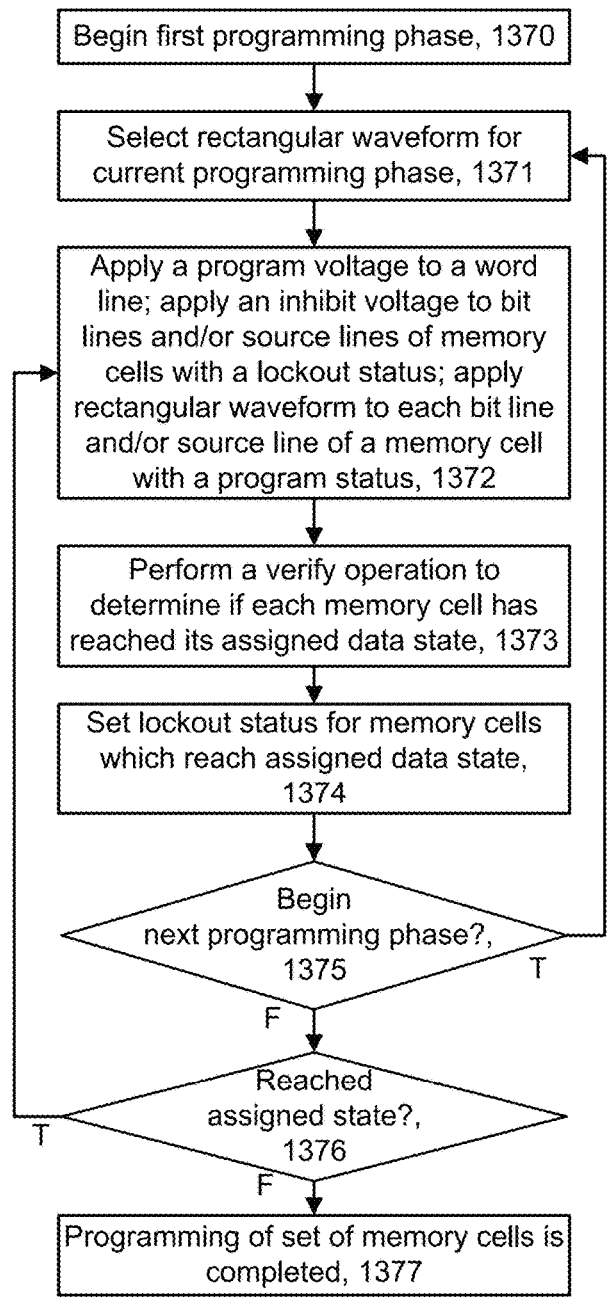
FIG. 13H depicts an example programming operation for a set of memory cells as an alternative or addition to FIG. 13A in which different rectangular waveforms are used in different programming phases.

FIG. 13H depicts an example programming operation for a set of memory cells as an alternative or addition to FIG. 13A in which different rectangular waveforms are used in different programming phases. Step 1370 begins a first programming phase of a program operation. Step 1371 selects a rectangular waveform for the current programming phase. The duty cycle of the rectangular waveform is based on the programming phase. Different rectangular waveforms may be selected for different programming phases. Step 1372 includes applying a program voltage to a word line while applying an inhibit voltage to bit lines and/or source lines of memory cells with a lockout status and applying a rectangular waveform to each bit line and/or source line of memory cells with a program status. Step 1373 includes performing a verify operation to determine if each memory cell has reached its assigned data state. Step 1374 sets a lockout status in the latches for memory cells which reach their assigned state. Decision step 1375 determines if a next programming phase begins. One approach is to begin each programming phase at a predetermined program-verify iteration. Another approach is to begin a next programming phase based on a programming progress of the cells, e.g., based on whether a specified portion of cells have reached a particular assigned state.

If decision step 1375 is true, step 1371 is reached where a new rectangular waveform may be selected for the next programming phase. If decision step 1375 is false, decision step 1376 is reached. If the cells have reached their assigned states, the programming of the set of memory cells is completed at step 1377. If decision step 1376 is false, step 1372 is reached, where the rectangular waveform with the same duty cycle is used again.

Figure 13I:
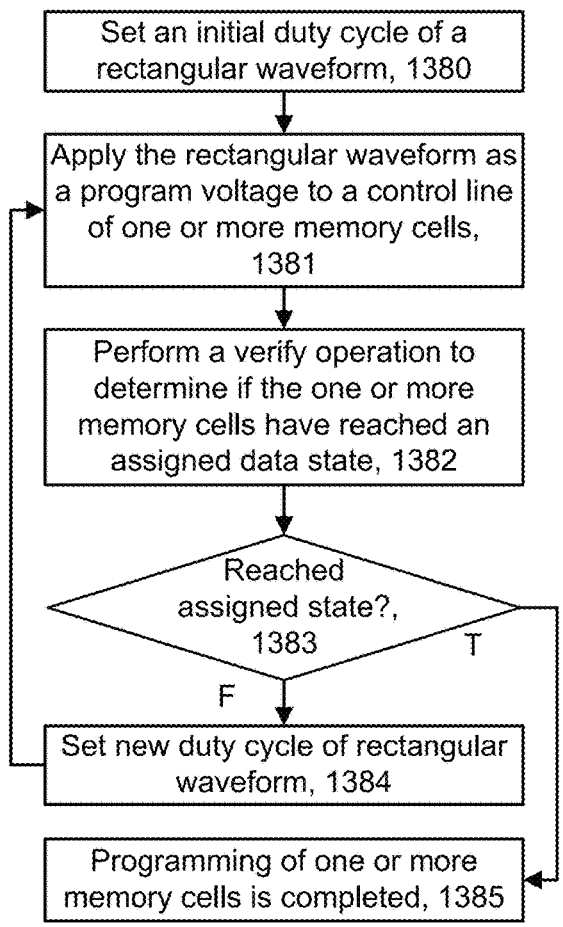
FIG. 13I depicts an example programming operation in which a program voltage is provided by a rectangular waveform.

FIG. 13I depicts an example programming operation in which a program voltage is provided by a rectangular waveform. As mentioned, a rectangular waveform may be used as a program, read, verify or erase voltage, for instance. Step 1380 includes setting an initial duty cycle of a rectangular waveform. This duty cycle provides a corresponding effective voltage. Step 1381 includes applying the rectangular waveform as a program voltage to a control line of one or more memory cells. Step 1382 includes performing a verify operation to determine if the one or more memory cells have reached an assigned data state. If decision step 1383 is true, the programming of the one or more memory cells is completed at step 1385. If the decision step is false, step 1384 sets a new duty cycle of the rectangular waveform. For example, a higher program voltage can be provided using a higher duty cycle. Step 1381 is then repeated. Incremental step pulse programming may be provided using a single voltage source by varying the duty cycle.

Figure 13J:
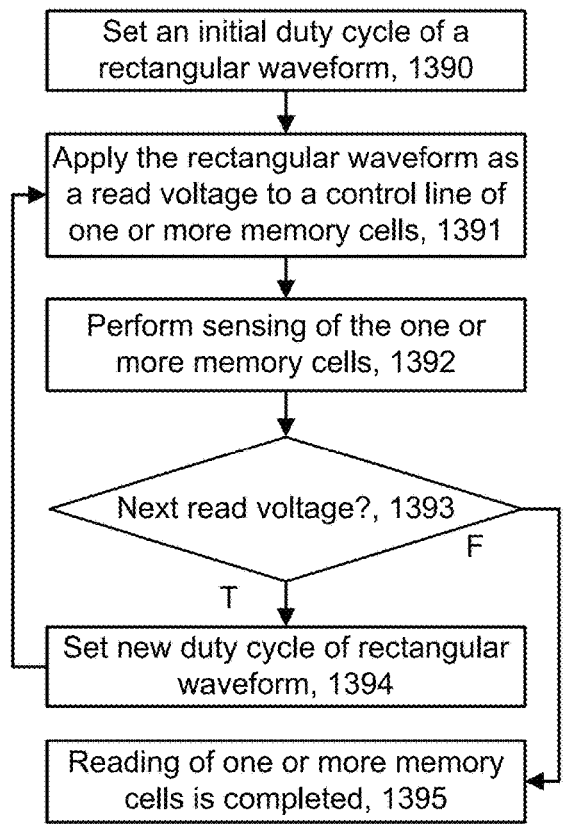
FIG. 13J depicts an example read operation in which a read voltage is provided by a rectangular waveform.

FIG. 13J depicts an example read operation in which a read voltage is provided by a rectangular waveform. Step 1390 includes setting an initial duty cycle of a rectangular waveform. Step 1391 includes applying the rectangular waveform as a read voltage to a control line, e.g., word line, of one or more memory cells. Step 1392 includes performing sensing of the one or more memory cells. Step 1393 determines whether there is a next read voltage to apply in the read operation. If decision step 1393 is false, the reading of the one or more memory cells is completed at step 1395. If the decision step is true, step 1394 sets a new duty cycle of the rectangular waveform. For example, a higher read voltage can be provided using a higher duty cycle. Step 1391 is then repeated.

FIG. 14A depicts an example rectangular waveform which alternates between a lower voltage VL and a higher voltage VH. As mentioned, the duty cycle of this rectangular waveform is Th/T.

FIG. 14B depicts an example rectangular waveform which varies between a lower voltage VL and two higher voltages VH1 and VH2. As mentioned, the duty cycle of this rectangular waveform is (Th2+Th1)/T.

FIG. 14C depicts a voltage on a control line which receives the rectangular waveform of FIG. 14A, showing a settling time (ST) and a cyclostationary condition (CC). The vertical axis depicts voltage and the horizontal axis depicts time. The voltage 1410 is a rectangular waveform which reaches a steady state effective voltage (Veff) after the settling time. The voltage varies in a range+/−Vr about Veff. Various factors affect the settling time, including the RC time constant of the control line.

The techniques described herein exploit the inherent RC delay of a control line. In one approach, a voltage source which outputs a single steady state voltage can be used to provide voltage waveforms with different effective voltages. Further, with appropriate design of the frequency and duty cycle, any intermediate bias level (between VL and VH) can be provided on a control line without compromising the settling time. A voltage driver can be pulsed at a frequency (f) and a duty cycle (d) between two levels, e.g., VL and VH. Since there is finite RC delay in the control line, the driver impulse will propagate to the control line at a slowed rate. After a settling time, a condition is reached when the discharge during the low state (VL) is exactly equal to the charging during the high state (VH), and a cyclostationary condition is reached. The control line will have an effective direct current (DC) voltage.

If the frequency of the driver is chosen above some critical value, the control line voltage will remain at the desired DC level. The number of electrons in the channel of the memory string which is connected to the control line, e.g., a bit line or source line, will essentially remain constant and maintain the DC level.

FIG. 14D depicts a voltage on a control line which receives the rectangular waveform of FIG. 14A, where the rectangular waveform is provided at different frequencies. The frequencies in this example are 100 kHz, 200 kHz, 500 kHz, 1 MHz and 5 MHz. The pulsed aspect of the waveform is attenuated as the frequency is increased. The test parameters included VH=5 V, RC=5 μsec. and the duty cycle d=0.7. At lower frequencies, the control line experiences relatively more oscillations. However, as the frequency of the driving pulse increases, the oscillation reduces. After a critical frequency, the oscillation is essentially gone. At this point, the channel electrons do not respond to the variations in the driving pulse, and maintain a DC level. The critical frequency is related to the RC of the control line. In this example, the critical frequency is about 5/RC. The rectangular waveform should have a driving frequency at or above the critical frequency.

FIG. 14E depicts a voltage on a control line which receives the rectangular waveform of FIG. 14A, where the rectangular waveform is provided at different duty cycles. Different rectangular waveforms are depicted with duty cycles of 0, 0.1, 0.2, 0.3, 0.4, 0.5, 0.6, 0.7, 0.8, 0.9 and 1. A reference voltage Vref is reached in the case of duty cycle=1. In this example, f=1 MHz which results in a small oscillation which may be acceptable. A higher frequency such as 5 MHz can completely eliminate the oscillation. Regardless of the frequency, the final, effective voltage is Veff=duty cycle× VH. Since Veff increases linearly with an increase in the duty cycle, any arbitrary level can be conveniently achieved from just one input bias level, e.g., VH. Also, since Veff is not a function of RC, the desired voltage level is insensitive to variations in RC. This is an advantage in a case where control lines have RC variations, e.g., due to variations in the fabrication process.

Also in this example, the steady state level is reached within about 20 μsec. regardless of the frequency and duty cycle. This is equal to or better than the settling time of a comparable DC voltage. Thus, this technique does not compromise on the settling time to provide an arbitrary voltage.

Figure 15:
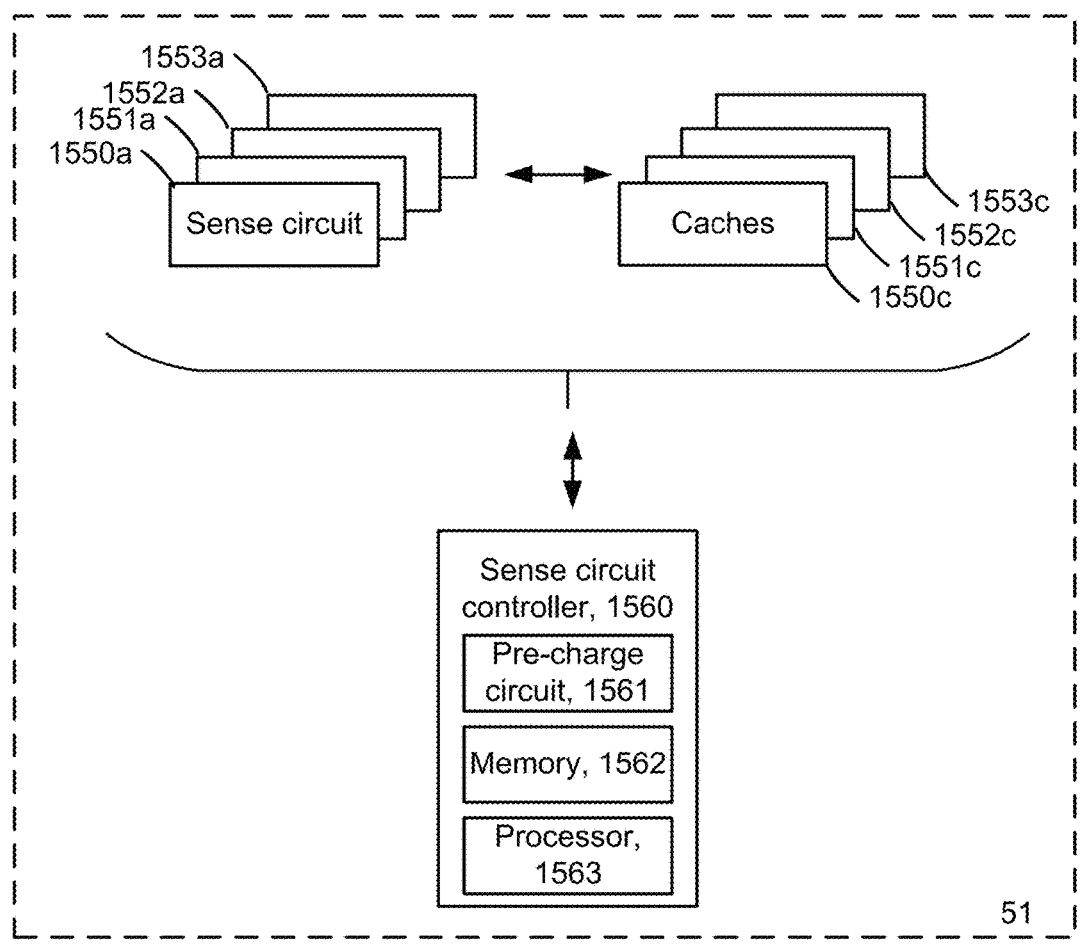
FIG. 15 depicts an example block diagram of a sense block 51 in the column control circuitry of FIG. 1.

FIG. 15 depicts an example block diagram of a sense block 51 in the column control circuitry of FIG. 1. The column control circuitry can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 1550a, 1551a, 1552a and 1553a are associated with caches 1550c, 1551c, 1552c and 1553c, respectively.

In one approach, different subsets of bit lines can be sensed using different respective sense blocks. This allows the processing load which is associated with the sense circuits to be divided up and handled by a respective processor in each sense block. For example, a sense circuit controller 1560 can communicate with the set, e.g., sixteen, of sense circuits and latches. The sense circuit controller may include a pre-charge circuit 1561 which provides a voltage to each sense circuit for setting a pre-charge voltage. The sense circuit controller may also include a memory 1562 and a processor 1563.

Further example details of the sense circuit controller and the sense circuits are provided below.

FIG. 16 depicts another example block diagram of a sense block 51 in the column control circuitry of FIG. 1. The sense circuit controller 1660 communicates with multiple sense circuits including example sense circuits 1650a and 1651a. The sense circuit 1650a includes latches 1650b, including a trip latch 1626 and one or more assigned data state latches 1627. For instance, these additional latches may store two bits of data referred to as D1 and D2. One or more additional data latches 1628 can be provided to store programming (prog.) speed data in some embodiments. The sense circuit further includes a voltage clamp 1621 such as a transistor which sets a pre-charge voltage at a sense node 1622 (SEN). A sense node-to-bit line (BL) switch 1623 selectively allows the sense node to communicate with a bit line 1625, e.g., the sense node is electrically connected to the bit line so that the sense node voltage can decay. The bit line 1625 is connected to one or more memory cells, such as a memory cell MC1. A voltage clamp 1624 can set a voltage on the bit line, such as during a sensing operation or during a program voltage. A local bus, LBUS1, allows the sense circuit controller to communicate with components in the sense circuit, such as the latches 1650b and the voltage clamp in some cases. To communicate with the sense circuit 1650a, the sense circuit controller provides a voltage via a line 1602 to a transistor 1604 to connect LBUS1 with a data bus DBUS, 1603. The communicating can include sending data to the sense circuit and/or receive data from the sense circuit.

The sense circuit controller can communicate with different sense circuits in a time-multiplexed manner, for instance. A line 1605 may be connected to the voltage clamp in each sense circuit, in one approach.

The sense circuit 1651a includes latches 1651b, including a trip latch 1646 and one or more assigned data state latches 1647. One or more additional data latches 1648 can be provided to store programming speed data in some embodiments. A voltage clamp 1641 may be used to set a pre-charge voltage at a sense node 1642 (SEN). A sense node-to-bit line (BL) switch 1643 selectively allows the sense node to communicate with a bit line 1645, and a voltage clamp 1644 can set a voltage on the bit line. The bit line 1645 is connected to one or more memory cells such as a memory cell MC2. A local bus, LBUS2, allows the sense circuit controller to communicate with components in the sense circuit, such as the latches 1651b and the voltage clamp in some cases. To communicate with the sense circuit 1651a, the sense circuit controller provides a voltage via a line 1601 to a transistor 1606 to connect LBUS2 with DBUS. The lines 1601 and 1602 can be considered to be sense amplifier control (sac) lines.

The example memory cells MC1 and MC2 are connected to a selected word line WLn.

The sense circuits may also include a bit line decoder 1650c and 1651c which provide a rectangular waveform as described herein, in response to one or more rectangular waveforms provided by a voltage source 1670. See examples of decoders and rectangular waveforms at FIG. 18A to 20.

A cache may be associated with each sense circuit and connected to DBUS.

During a program operation, the data latches 1627 and 1628 may store data which identifies an assigned data state of a cell connected to the bit line 1625, and the data latches 1646 and 1647 may store data which identifies an assigned data state of a cell connected to the bit line 1645. In this example, there are four data states represented by two bits of data. Additional latches can be provided to represent the assigned data states when there are eight or more states.

During a read operation, the data latches may store data which results from sensing of the respective memory cells.

FIG. 17 depicts an example circuit 1700 for providing voltages to blocks of memory cells. In this example, a row decoder 1701 provides voltages to word lines and select gates of each block in set of blocks 1710. The set could be in a plane and includes blocks 1711 to 1719. The row decoder provides a control signal to pass gates 1722 which connect the blocks to the row decoder. Typically, operations, e.g., program or read, are performed on one selected block at a time. The row decoder can connect global word lines 1702 to local word lines 1703. Voltages are provided on the global word lines from a voltage source 1720. The voltage source may provide a few different voltages to switches 1721 which connect to the global word lines. For example, during a programming operation, a program voltage may be provided on a selected global word line which is connected to a selected local word line of a selected block which is to be programmed. A pass voltage may be provided on remaining, unselected global word lines which is connected to unselected local word lines of the selected block.

The various components, including the row decoder, bit line decoders and source line decoder may receive commands from a controller such as the state machine 112 or the controller 122 to perform the functions described herein.

A set of source lines 1732 is shared by the blocks. A voltage source 1730 provides voltages to source line decoders 1731 which, in turn, connect the voltages to the source lines. A set of bit lines 1742 is also shared by the blocks. A voltage source 1740 provides voltages to the bit line decoders 1741 which, in turn, connect the voltages to the bit lines. In one option, a voltage source is shared by the bit line decoders and source line decoders. Rectangular waveforms as described herein may be provided by one or more of the voltage sources 1720, 1730 and 1740.

Figure 18A:
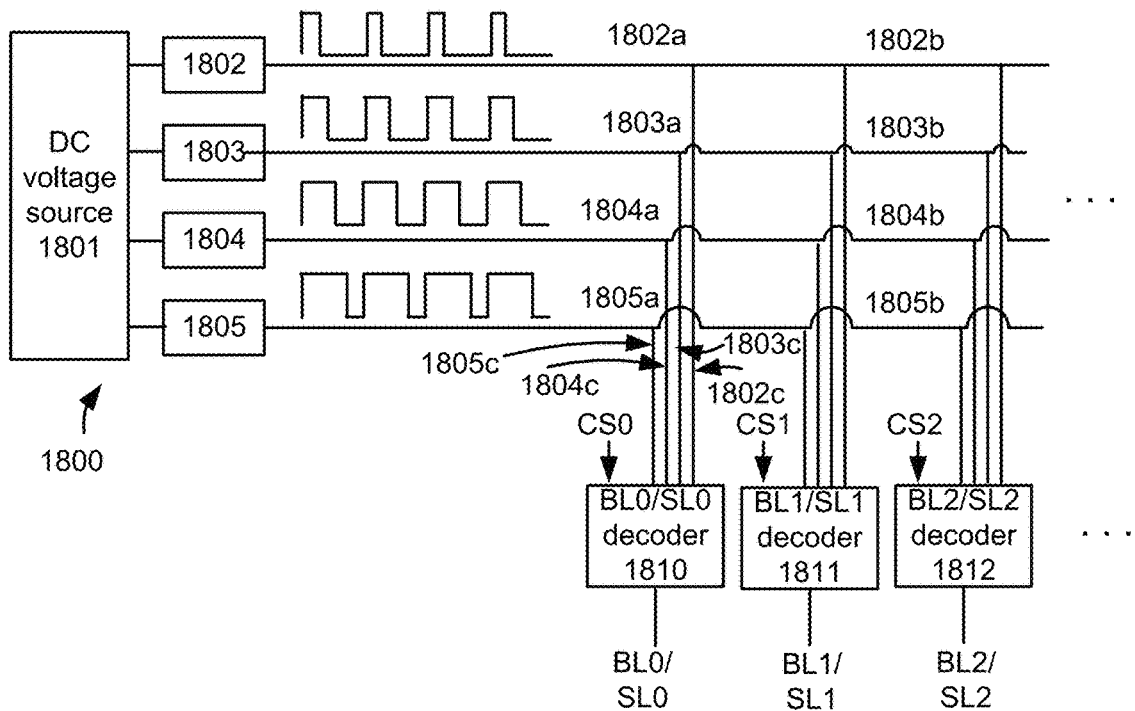
FIG. 18A depicts an example circuit in which a voltage source provides rectangular waveforms with different duty cycles to control line decoders.

FIG. 18A depicts an example circuit 1800 in which a voltage source provides rectangular waveforms with different duty cycles to control line decoders. The decoders are bit line and/or source line decoders in FIGS. 18A, 18B and 21A. A DC voltage source 1801 provides a DC voltage to pulsing circuits 1802 to 1805. The DC voltage source can be provided by a charge pump, chip level power supply or other source. In the case of a charge pump an input voltage is boosted to a higher voltage. In the case of a step down power converter, an input voltage is reduced to a lower voltage. In one approach, the DC voltage source provides the highest DC voltage which is used on the control lines, e.g., 6 V per FIG. 12A. This is the voltage VH. This DC voltage may be pulsed to provide rectangular waveforms with duty cycles of less than 100% and corresponding effective voltages of less than 6 V, e.g., 4.8 V, 4.0 V, 3.2 V, 2.4 V, 1.6 V and 0.8 V. Advantageously, one DC voltage source can be used to provide multiple effective voltages concurrently or sequentially. This provides savings in terms of space used on the chip, power consumption and performance.

The pulsing circuits include switches and timing signals which pulse the DC signal at different duty cycles to provide rectangular waveforms 1802a to 1805a on lines 1802b to 1805b, respectively. In one approach, the rectangular waveforms have a common frequency or period. Each line is connected to the decoders which include a BL0/SL0 decoder 1810, a BL1/SL1 decoder 1811 and a BL2/SL2 decoder 1812. For example, lines 1802b to 1805b are connected to the decoder 1810 via connecting lines 1802c to 1805c, respectively. Each decoder is responsive to a control signal (CS0, CS1 or CS2) for selecting the rectangular waveform of one of the lines. As mentioned, the selection may be based on a programming data associated with the memory cell of an associated memory cell, a programming phase or other factor. The decoders connect the selected rectangular waveform to the respective control line, e.g., BL0/SL0, BL1/SL1 or BL2/SL2.

Figure 18B:
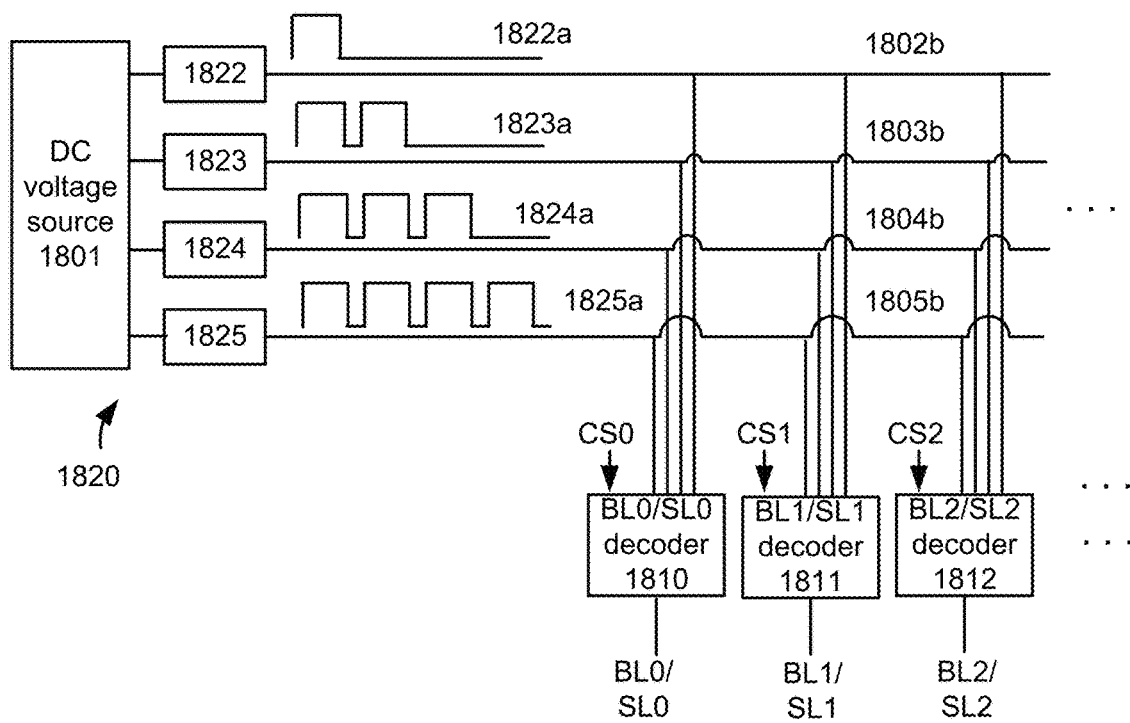
FIG. 18B depicts an example circuit in which a voltage source provides rectangular waveforms with different duty cycles to control line decoders using pulse counting.

FIG. 18B depicts an example circuit 1820 in which a voltage source provides rectangular waveforms with different duty cycles to control line decoders using pulse counting. The DC voltage source 1801 provides a DC voltage to pulsing circuits 1822 to 1825 which are configured as pulse counting circuits. The pulsing circuits include switches and timing signals which pass a specified number of pulses per time period to provide rectangular waveforms 1822a to 1825a on lines 1802b to 1805b, respectively. In one approach, the rectangular waveforms have a common frequency or period. Each line is connected to the decoders as mentioned, and each decoder is responsive to a control signal (CS) for selecting the rectangular waveform of one of the lines.

FIG. 19A depicts an example decoder 1810 consistent with FIGS. 18A and 18B. The connecting lines 1802c to 1805c each receive a rectangular waveform such as one of the rectangular waveforms 1802a to 1805a in FIG. 18A or one of the rectangular waveforms 1822a to 1825a in FIG. 18B. The decoder includes a set of transistors, such as transistors 1901 and 1902 connected between each connecting line and the control line. In one approach, N transistors are connected in series to each connecting line, where 2^N is the number of connecting lines and rectangular waveforms input to the decoder. Based on data latch values such as depicted in FIG. 19B, the decoder will pass one of the rectangular waveforms to the control line. For example, the inverse of DL1 is provided to the control gate of the transistor 1901 and the inverse of DL2 is provided to the control gate of the transistor 1902. The rectangular waveform on the connecting line 1805c is passed if DL1=0 and DL2=0. The rectangular waveform on the connecting line 1804c is passed if DL1=0 and DL2=1. The rectangular waveform on the connecting line 1803c is passed if DL1=1 and DL2=0. The rectangular waveform on the connecting line 1802c is passed if DL1=1 and DL2=1. Recall that DL1 and DL2 are bits of data in the latches 1627 and 1647 of FIG. 16. These bits may represents the assigned data state.

FIG. 19B depicts an example table showing data values for the transistors in the decoder of FIG. 19A. The data latches correspond to those depicted in FIG. 16 in one implementation. The latch value may represent an assigned data state, for instance, or a programming speed category, or both of these.

FIG. 20 depicts examples of rectangular waveforms with different duty cycles using pulse counting, consistent with FIG. 18B. The rectangular waveform 2000 includes a uniform sequence of pulses 2001 to 2008. Each pulse has an upper amplitude of VH and a lower amplitude of VL. A period T which encompasses four pulses in this example is depicted for reference. Each pulse has a duration of Th at VH and the rectangular waveform is at VL for Tl between pulses. The duty cycle is 4×Th/(4×Th+4×Tl) or Th/(Th+Tl).

The rectangular waveforms are time aligned with one another. Pulse counting involves passing all, or fewer than all, of the pulse within the period T to the control line. The rectangular waveform 2010 is obtained by passing pulses 2001 and 2005 and blocking the other pulses. The duty cycle is one fourth of the duty cycle of the rectangular waveform 2000 since one of four pulses is passed.

The rectangular waveform 2020 is obtained by passing pulses 2001, 2002, 2005 and 2006 and blocking the other pulses. The duty cycle is one half of the duty cycle of the rectangular waveform 2000 since two of four pulses is passed.

The rectangular waveform 2030 is obtained by passing pulses 2001, 2002, 2005 and 2006 and blocking the other pulses, followed by passing pulses 2031, 2032, 2033 and 2034. This approach changes the pulses that are passed in each period. Essentially, the first and second pulses of a period are passed in periods T1 and T2 followed by passing the first and third pulses in periods T3 and T4. The duty cycle is one half of the duty cycle of the rectangular waveform 2000 since two of four pulses is passed per period. Other variations are possible as well. For example, pulse counting can be performed from a sequence of pulses which have varying amplitudes such as in FIG. 14B.

The rectangular waveform 2040 is obtained by passing pulses 2001, 2002, 2003, 2005, 2006 and 2007 and blocking the other pulses. The duty cycle is three fourths of the duty cycle of the rectangular waveform 2000 since three of four pulses is passed.

Figure 21A:
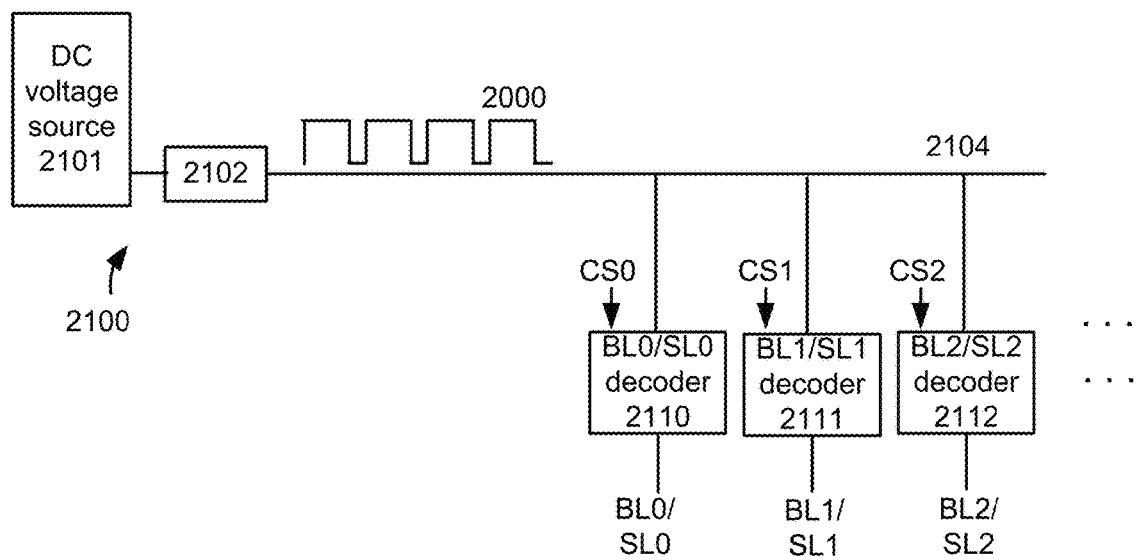
FIG. 21A depicts an example circuit in which a voltage source provides a rectangular waveform with a fixed duty cycle to control line decoders, and the decoders perform pulse counting.

FIG. 21A depicts an example circuit 2100 in which a DC voltage source 2101 provides the rectangular waveform 2000 with a fixed duty cycle to control line decoders 2110, 2111 and 2112 via a line 2104, and the decoders perform pulse counting. A pulsing circuit such as a switch 2102 is used to provide the rectangular waveform 2000 of FIG. 20. In this example, the decoders perform the switching which results in modifying the rectangular waveform. An advantage is that fewer connecting lines from the voltage source to the decoder are used compared to FIGS. 18A and 18B. A disadvantage is that the path over which the rectangular waveform travels is shorter and therefore has a smaller RC, so there may a larger ripple in the waveform compared to the approach of FIG. 18B.

Figure 21B:
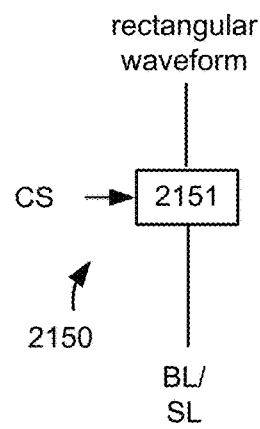
FIG. 21B depicts an example circuit for performing pulse counting in the decoders of FIG. 21A.

FIG. 21B depicts an example circuit 2150 for performing pulse counting in the decoders of FIG. 21A. The circuit includes a switch 2151 which is responsive to a control signal (CS) for passing or blocking pulses in the rectangular waveform.

In one implementation, an apparatus comprises: a control line connected to a memory cell; a voltage source connected to the control line; latches storing data programming data associated with the memory cell; and a controller configured to read the data from the latches and to cause the voltage source to provide a rectangular waveform on the control line, wherein the rectangular waveform has a duty cycle which is based on the programming data associated with the memory cell.

In another implementation, a method comprises: providing one rectangular waveform and another rectangular waveform from a direct current voltage source; and concurrently performing programming operations on one memory cell and another memory cell, wherein the programming operations comprise applying the one rectangular waveform to the one memory cell and applying the another rectangular waveform to the another memory cell, and the one rectangular waveform and the another rectangular waveform have different duty cycles.

In another implementation, an apparatus comprises: means for applying a series of program voltages to a set of memory cells, the series of program voltages comprising one subset of program voltages followed by another subset of program voltages; means for pulsing a direct current voltage at one duty cycle to provide one rectangular waveform during the one subset of program voltages; means for applying the one rectangular waveform to one subset of memory cells in the set of memory cells during the one subset of program voltages; means for pulsing the direct current voltage at another duty cycle in place of the one duty cycle to provide another rectangular waveform during the another subset of program voltages; and means for applying the another rectangular waveform to another subset of memory cells in the set of memory cells during the another subset of program voltages.

The means described above can include the components of the memory device 100 of FIG. 1 and FIG. 2, for example. The power control module 116, for instance, controls the power and voltages supplied to the word lines, select gate lines and bit lines during memory operations. Moreover, the means described above can include the components of FIG. 17 to 21B including the decoders, voltage drivers, switches and pass transistors. The means can further include any of the control circuits in FIGS. 1 and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a control line connected to a memory cell;
   a voltage source connected to the control line;
   latches storing programming data associated with the memory cell; and
   a controller configured to read the programming data from the latches and to cause the voltage source to provide a rectangular waveform on the control line, wherein the rectangular waveform has a duty cycle which is based on the programming data associated with the memory cell.

2. The apparatus of claim 1, wherein:
   the voltage source comprises a plurality of pulsing circuits operating at a different duty cycle; and
   the controller configured to connect one of the pulsing circuits to the control line.

3. The apparatus of claim 2, further comprising:
   a decoder connected to the plurality of pulsing circuits, the decoder configured to connect the one of the pulsing circuits to the control line in response to a control signal from the controller.

4. The apparatus of claim 1, wherein:
   the voltage source comprises a plurality of pulsing circuits operating at a different duty cycle; and
   the voltage source is configured to concurrently provide rectangular waveforms with the different duty cycles to control lines of memory cells with different programming data.

5. The apparatus of claim 1, wherein:
   the voltage source comprises a pulsing circuit configured to output a series of pulses; and
   the voltage source configured to pass different numbers of pulses per time period from the series of pulses to concurrently provide rectangular waveforms with different duty cycles to control lines of memory cells with different programming data.

6. The apparatus of claim 1, wherein:
   the programming data associated with the memory cell comprises an assigned data state of the memory cell;
   the voltage source comprises a pulsing circuit configured to output a series of pulses; and
   the controller, to cause the voltage source to provide the rectangular waveform on the control line, is configured to pass a specified number of pulses per time period from the series of pulses to the control line based on the assigned data state.

7. The apparatus of claim 1, wherein:
   the programming data associated with the memory cell comprises a programming speed category of the memory cell;
   the voltage source comprises a pulsing circuit configured to output a series of pulses; and
   the controller, to cause the voltage source to provide the rectangular waveform on the control line, is configured to pass a specified number of pulses per time period from the series of pulses to the control line based on the programming speed category of the memory cell.

8. The apparatus of claim 1, wherein:
   the programming data associated with the memory cell comprises an assigned data state of the memory cell;
   the memory cell is in a string of memory cells;
   each memory cell in the string is connected to a respective word line;
   the control line is connected to one end of the string; and
   the controller, to program the memory cell, is configured to perform multiple program-verify iterations, and to perform each program-verify iteration, the controller is configured to:
   apply a program voltage followed by a verify voltage to the respective word line of the memory cell;
   during the program voltage, apply multiple periods of the rectangular waveform to the control line with the duty cycle based on an assigned data state of the memory cell; and
   during the verify voltage, apply multiple periods of the rectangular waveform to the control line with the duty cycle based on the assigned data state.

9. The apparatus of claim 1, wherein:
   the control line comprises a bit line connected to a drain of the memory cell or a source line connected to a source of the memory cell; and
   a series of program voltages is applied to a control gate of the memory cell during a programming operation; and
   the controller is configured to cause the voltage source to provide rectangular waveforms with different duty cycles on the bit line or source line during different program voltages in the series of program voltages.

10. The apparatus of claim 1, wherein:
    the control line comprises a bit line connected to a drain of the memory cell or a source line connected to a source of the memory cell; and
    the rectangular waveform is provided on the bit line during a verify or read operation of the memory cell.

11. The apparatus of claim 1, wherein:
    the rectangular waveform has a frequency of at least 5 divided by RC, where RC is a time constant of the control line.

12. The apparatus of claim 1, wherein:
    the rectangular waveform has an amplitude which is based on the programming data associated with the memory cell.

13. The apparatus of claim 1, wherein:
    the rectangular waveform comprises a cyclostationary signal.

14. A method, comprising:
    providing one rectangular waveform and another rectangular waveform from a direct current voltage source; and
    concurrently performing programming operations on one memory cell and another memory cell, wherein the programming operations comprise applying the one rectangular waveform to the one memory cell and applying the another rectangular waveform to the another memory cell, and the one rectangular waveform and the another rectangular waveform have different duty cycles.

15. The method of claim 14, wherein:
    the duty cycles of the one rectangular waveform and the another rectangular waveform are based on assigned data states of the one memory cell and the another memory cell, respectively.

16. The method of claim 14, wherein:
the duty cycles of the one rectangular waveform and the another rectangular waveform are based on programming speed categories of the one memory cell and the another memory cell, respectively.

17. An apparatus, comprising:
a control line connected to a memory cell;
a voltage source connected to the control line;
latches storing programming data associated with the memory cell; and
a controller configured to read the data from the latches and to cause the voltage source to provide a rectangular waveform on the control line, wherein the rectangular waveform has a duty cycle which is based on the programming data, and the programming data is selected from the group consisting of programming speed category and assigned data state.

* * * * *